(12) United States Patent
Lee

(10) Patent No.: US 6,432,795 B1
(45) Date of Patent: Aug. 13, 2002

(54) METHOD OF FABRICATING A CYLINDRICAL CAPACITOR STORAGE NODE HAVING HSG SILICON ON INNER WALL THEREOF IN A SEMICONDUCTOR DEVICE

(75) Inventor: Kyu-Hyun Lee, Kyunggi-do (KR)

(73) Assignee: Samsung Electronics Co., Ltd., Kyunggi-Do (KR)

( * ) Notice: Subject to any disclaimer, the term of this patent is extended or adjusted under 35 U.S.C. 154(b) by 0 days.

(21) Appl. No.: 09/705,786

(22) Filed: Nov. 6, 2000

(30) Foreign Application Priority Data

Nov. 6, 1999 (KR) .............................. 99-49109

(51) Int. Cl.⁷ ........................................ H01L 21/8242
(52) U.S. Cl. ...................................... 438/398; 438/255
(58) Field of Search ........................ 438/3, 240, 396, 438/397, 398, 253, 254, 255

(56) References Cited

U.S. PATENT DOCUMENTS 5,418,180 A * 5/1995 Brown
5,795,805 A * 8/1998 Wu et al. .................... 438/253
5,849,624 A * 12/1998 Fazan et a. .................. 438/398
5,892,702 A 4/1999 Okamoto et al.
5,981,334 A * 11/1999 Chien et al. ................. 438/253
6,177,695 B1 * 1/2001 Jeng ............................ 257/296
6,228,711 B1 * 5/2001 Hsieh .......................... 438/255

* cited by examiner

Primary Examiner—Tuan H. Nguyen
(74) Attorney, Agent, or Firm—Volentine Francos, PLLC

(57) ABSTRACT

A method of fabricating a capacitor storage node having HSG silicon on inner walls thereof, wherein the HSG silicon is formed on the inner walls of the storage node after a sacrificial insulating layer is removed, thereby increasing overall surface area of the storage node and preventing electrical bridges between adjacent storage nodes. The storage node is made of a double layer including a layer of crystallized silicon and a layer of amorphous silicon, formed in a storage opening that is formed in the sacrificial insulating layer. The crystallized silicon defines outer walls of the storage node and the amorphous silicon defines inner walls. After forming the storage node opening in the sacrificial insulating layer, crystallized silicon is formed in the opening. Amorphous silicon is then formed on the crystallized silicon. After removing the sacrificial insulating layer, HSG silicon is formed on the amorphous silicon layer.

23 Claims, 33 Drawing Sheets

METHOD OF FABRICATING A CYLINDRICAL CAPACITOR STORAGE NODE HAVING HSG SILICON ON INNER WALL THEREOF IN A SEMICONDUCTOR DEVICE

This application claims priority under 35 U.S.C. §119 to Korean Patent Application No. 99-49109, filed on Nov. 6, 1999, the contents of which are herein incorporated by reference in their entirety.

BACKGROUND OF THE INVENTION

1. Field of the Invention

The present invention relates to semiconductor manufacturing, and more particularly to a method of fabricating a cylindrical capacitor storage node having HSG silicon on inner walls of the cylindrical storage node.

2. Description of the Related Art

Recent advances in the scaling-down of integrated circuit devices have led to smaller wafer areas. High-density DRAM (dynamic random access memory) devices, for example, leave little room for a storage node of a memory cell. Yet even as the footprint (area of a silicon wafer allotted for individual memory cells) shrinks, the storage node must maintain a certain minimum charge storage capacity (cell capacitance), determined by design and operational parameters, to ensure reliable operation of the memory cell. Cell capacitance must be maintained at least 25 fF for preventing and limiting soft-error rate caused by alpha-particle interference and data-error rate caused by noise. It is thus increasingly important in the semiconductor integrated circuits industry of high-level integration that capacitors achieve a high charge storage per unit area of the wafer. For this reason, capacitor structures have become more and more complicated, from planar cell to trench cell or stack cell designs, and the CUB (capacitor under bit line) structure is being replaced by COB (capacitor over bit line) structure.

As is well known, cell capacitance may be represented by the following equation: C (capacitance)=$\epsilon \times A/d$, where $\epsilon$ is the dielectric constant of the capacitor dielectric, A is the electrode area and d represents the spacing between electrodes (thickness of the dielectric film). Accordingly, several techniques have been recently developed to increase the overall capacitance of the cell capacitor without significantly affecting the wafer area occupied by the cell. A first way is to use new materials having high dielectric constant. A second way is to form very thin dielectric films. A third way is to increase the effective surface area of the capacitor electrodes. However, application of high dielectric constant material as a dielectric film is still under study, and also has some problems associated with reliability. In addition, it is very difficult to form such thin dielectric films without reliability problems.

Accordingly, the third way is generally used to increase capacitance of the cell capacitor. To this end, three-dimensional capacitors such as stacked-type, cylindrical-type, trench-type, fin-type or the like, have been suggested to increase cell capacitance in a given cell area. Since both outer and inner surfaces can be utilized as an effective capacitor area, the cylindrical structure is favorably suitable for use as a three-dimensional capacitor, and is more particularly suitable for an integrated memory cell. Furthermore, new technologies have recently been developed for increasing the effective surface area by modifying the surface morphology of the polysilicon storage electrode itself, by engraving or controlling the nucleation and growth conditions of polysilicon. A hemispherical-grain (HSG) polysilicon layer can be deposited over a storage node to increase surface area and capacitance. However, as design rules have been scaled down to sub-quarter micron level, the possibility of an electrical bridge between adjacent storage nodes significantly increases when HSG silicon is grown on the outer surface of the cylindrical storage node.

To solve this problem associated with electrical bridges, a method for forming HSG silicon only on an inner surface of the cylindrical storage node has been suggested. Such method includes the step of forming HSG silicon on an inner surface of the cylindrical storage node, and then removing a sacrificial oxide layer to expose an outer surface of the storage node, by using wet chemicals. However, this method also has the problem associated with electrical bridges between adjacent storage nodes. In this case, the HSG silicon dislodges from the inner surface of the storage node during the step of removing the sacrificial oxide layer by wet etching, thereby causing an electrical bridge.

U.S. Pat. No. 5,892,702, the disclosure of which is incorporated herein by reference, discloses a method for fabricating a cylindrical capacitor having HSG on an inner surface of a storage node. FIGS. 1A to 1J are cross-sectional views of a semiconductor substrate 10, at selected stages of a cylindrical capacitor fabrication process in U.S. Pat. No. 5,892,702. Referring to FIG. 1A, an opening 49 is formed in a sacrificial oxide layer 48. Thin second amorphous silicon layer 50 is formed in the opening 49 as shown in FIG. 1B. Resist layer 51 is formed to fill the opening 49 as shown in FIG. 1C. A planarization process is carried out to separate the device by unit cell, down to the sacrificial oxide layer 48, as shown in FIG. 1D. Next, as shown in FIGS. 1E and 1F, the sacrificial oxide layer 48 and the underlying first amorphous silicon layer 47a are respectively removed to form space 260 having amorphous silicon sidewall 28. The space 260 is filled with a spin-on-glass layer 52 as shown in FIG. 1G. Next, the remainder of the resist layer 51 in the opening 49 is selectively removed, thereby forming a cylindrical storage node 26 electrically isolated by the spin-on-glass layer 52 from adjacent nodes 261 and 262, as shown in FIG. 1H. HSG silicon 41 is formed on inner surfaces of the storage node (i.e., the second amorphous silicon 50) as shown in FIG. 1I. Thereafter, the spin-on-glass layer 52 is removed to expose outer surfaces of the storage node as shown in FIG. 1J.

However, when the spin-on-glass layer 52 is removed in this fabrication process as described with respect to FIG. 1J, HSG silicon 41 formed on inner surfaces of the storage node can be dislodged therefrom, to cause electrical bridges between adjacent storage nodes. Accordingly, there is a strong need for a method of fabricating a capacitor storage node with high cell capacitance, but without electrical bridges between adjacent storage nodes.

SUMMARY OF THE INVENTION

The present invention is therefore directed to a method of fabricating a cylindrical capacitor storage node having HSG silicon on inner walls thereof, which substantially overcomes one or more of the problems due to the limitations and disadvantages of the related art. More particularly, the present invention is directed toward providing a method of fabricating a capacitor storage node having HSG silicon only on inner walls thereof, without electrical bridges between adjacent storage nodes.

It is a feature of the present invention that HSG silicon is formed only on inner walls of the storage node. It is another feature of the present invention that HSG silicon is formed after a sacrificial oxide layer is removed. It is still another feature of the present invention that the storage node is made of a double layer-structure, one layer defining the inner wall of the storage node and the other defining an outer wall of the storage node, where the other layer defining the outer wall of the storage node is made of a conductive layer that suppresses the growth of HSG silicon thereon. It is still another feature of the present invention that a cylindrical opening for a storage node can be formed with a sufficient photolithography process margin.

To achieve these objectives and features, and other features in accordance with a first embodiment of the present invention, there is provided a method of fabricating a capacitor storage node. The method includes providing a semiconductor substrate. A lower insulating layer, an etching stopper layer and an upper insulating layer are sequentially formed on the semiconductor substrate. Preferably, the etching stopper layer is made of a silicon nitride and the upper insulating layer is made of a silicon oxide. The stacked layers are patterned to form a storage opening to a predetermined portion of the semiconductor substrate. A first conductive layer and a second conductive layer as for a storage node are formed on the upper insulating layer, following the topology of the storage opening therein. The first conductive layer is formed by the process of depositing an amorphous silicon, and annealing the amorphous silicon to crystallize it, to form polysilicon which suppresses growth of HSG silicon thereon. Alternatively, the first conductive layer can be directly made of polysilicon. Namely, polysilicon can be directly formed on the upper insulating layer as the first conductive layer.

The second conductive layer is formed by depositing amorphous silicon. The second and first conductive layers on the upper insulating layer are patterned to be left only in the storage opening, to form a storage node. The second conductive layer defines an inner wall of the storage node, and the first conductive layer defines an outer wall of the storage node that is in contact with (i.e., is surrounded by) the upper insulating layer. Using the etching stopper layer, the upper insulating layer is removed to expose the first conductive layer, i.e., the outer wall of the storage node. An HSG silicon forming process is carried out on the exposed inner and outer walls of the storage node. However, HSG silicon is grown only to a predetermined size on the inner wall of the storage node made of amorphous silicon. Since the outer wall of the storage node is made of crystallized silicon (polysilicon), HSG silicon can not be grown thereon. Accordingly, there are substantially no electrical bridges between adjacent storage nodes.

More particularly, forming the storage opening comprises patterning the upper insulating layer until the etching stopper layer is exposed, to form a storage node opening, and etching the exposed etching stopper layer and the lower insulating layer until the predetermined portion of the substrate is exposed, to form a storage contact opening that is aligned to the storage node opening. Preferably, the upper insulating layer is further selectively etched with respect to the etching stopper layer, to enlarge the dimension of the storage node opening, after forming the storage node opening.

Forming of the lower insulating layer comprises forming a first insulating layer over the semiconductor substrate, forming a bit line with a capping layer on the first insulating layer, forming a second insulating layer on the first insulating layer and on the bit line with the capping layer, forming a third insulating layer on the second insulating layer to prevent oxidation of the bit line, and forming a fourth insulating layer on the third insulating layer. Preferably the bit line capping layer has an etching selectivity with respect to the first and second insulating layers. The third insulating layer has an etching selectivity with respect to the second and fourth insulating layer and the etching stopper layer has an etching selectivity with respect to the fourth insulating layer. Preferably, the fourth insulating layer is made of silicon oxide, the third insulating layer is made of silicon nitride, the second and first insulating layers are made of silicon oxide and the bit line capping layer is made of silicon nitride. Etching the lower insulating layer for the formation of the storage node contact opening comprises etching the fourth insulating layer with an etching recipe that selectively etches silicon oxide with respect to the silicon nitride third insulating layer, etching the third insulating layer with an etching recipe that selectively etches silicon nitride with respect to the silicon oxide second insulating layer, and etching the second and first insulating layers with an etching recipe that selectively etches silicon oxide with respect to the silicon nitride bit line capping layer. The storage node contact opening is self-aligned to the storage node opening, and is formed between the bit line and an adjacent bit line, to expose the predetermined portion of the substrate.

Providing the semiconductor substrate comprises forming a transistor on the semiconductor substrate, forming an insulator on the transistor and on the semiconductor substrate, patterning the insulator to form a storage contact pad opening and a bit line contact pad opening away from the transistor, filling the storage contact pad opening and bit line contact pad opening with a conductive material, and planarizing the conductive material until the insulator is exposed, to form a storage contact pad and a bit line contact pad. The bit line is formed to be in electrical contact with the bit line contact pad, and the storage opening is formed to expose the storage contact pad.

Selective etching of the second and first conductive layers on the upper insulating layer, so as to be left only in the storage opening to thus form a storage node, comprises forming a planarizing insulating layer on the second conductive layer to fill the storage opening, etching the planarizing insulating layer, the second conductive layer and the first conductive layer until the upper insulating layer is exposed, and removing the remainder of the planarizing insulating layer in the storage opening, to expose the second conductive layer.

To achieve these objectives and features, and other features in accordance with a second embodiment of the present invention, there is provided a method of fabricating a capacitor storage node in a semiconductor device. The method includes forming a transistor on a semiconductor substrate. An insulator is formed on the substrate and on the transistor. A bit line contact pad and a storage contact pad are formed in the insulator away from the transistor, to be electrically connected to the semiconductor substrate. A first insulating layer is formed on the semiconductor substrate and on the contact pads. A bit line is formed on the first insulating layer to be electrically connected to the bit line contact pad through the first insulating layer. The bit line is made of a bit line conductive layer with a capping layer thereon and a side wall spacer. A second insulating layer is formed on the first insulating layer and on the bit line. A third insulating layer is formed on the second insulating layer to prevent the oxidation of the bit line. A fourth insulating layer is formed on the third insulating layer. An etching stopper layer is formed on the fourth insulating layer. A fifth sacrificial insulating layer is formed on the etching stopper layer. The stacked layers are patterned to form a storage opening which exposes the storage contact pad. A first conductive layer and a second conductive layer for a storage node are formed on the fifth sacrificial insulating layer and in the storage opening. The first conductive layer is made of a material that can prevent growth of HSG silicon on the surface thereof. As an example, polysilicon can be used. The polysilicon can be formed by a process of depositing amorphous silicon, and then annealing the amorphous silicon to crystallize it. Alternatively, the polysilicon can be directly deposited at a predetermined temperature.

The second conductive layer is made of a material layer that allows growth of HSG silicon on the surface thereof. As an example, amorphous silicon can be used. A sixth insulating layer is formed on the second conductive layer to fill the storage opening. The sixth insulating layer, and the second and first conductive layers, are etched until the fifth sacrificial insulating layer is exposed, to form a storage node. The remainder of the sixth insulating layer in the storage opening and the fifth sacrificial insulating layer outside of the storage node are removed, to expose an inner wall and an outer wall of the storage node. The second conductive layer defines the inner wall and the first insulating layer defines the outer wall. HSG silicon is formed on the inner wall.

More particularly, the first, second, fourth, fifth and sixth insulating layers respectively comprise an oxide; and the etching stopper layer, the third insulating layer, the bit line capping layer and the side wall spacer respectively comprise a silicon nitride.

Forming the storage opening comprises patterning the fifth sacrificial insulating layer until the etching stopper layer is exposed, to form a first opening for a storage node, and patterning the etching stopper layer and the fourth, third, second and first insulating layers, to form a second opening for a storage contact which exposes the storage contact pad. Preferably, the fifth sacrificial insulating layer is further selectively etched with respect to the etching stopper layer, to enlarge the first opening, after forming the first opening.

To achieve these objectives and features, and other features in accordance with a third embodiment of the present invention, there is provided a method of fabricating a capacitor storage node in a semiconductor device. The method includes forming a transistor on a semiconductor substrate. An insulator is formed on the substrate and on the transistor. A bit line contact pad and a storage contact pad are formed in the insulator away from the transistor, to be electrically connected to the substrate. A first insulating layer is formed to insulate the pads and transistor. A bit line is formed on the first insulating layer to be electrically connected to the bit line contact pad through the first insulating layer. The bit line is made of a bit line conductive layer with a capping layer thereon and a side wall spacer. A second insulating layer is formed on the first insulating layer and on the bit line. A storage contact plug is formed in the second and first insulating layers to be in electrical contact with the storage contact pad. An etching stopper layer and a sacrificial insulating layer are sequentially formed on the second insulating layer and the storage contact plug. The sacrificial insulating layer and the etching stopper layer are patterned to form a storage node opening. A first conductive layer and a second conductive layer for a storage node are formed on the sacrificial insulating layer and in the storage opening. The first conductive layer is made of a material layer that can prevent growth of HSG silicon on the surface thereof. As an example, polysilicon can be used. The polysilicon can be formed by the process of depositing amorphous silicon, and then annealing the amorphous silicon to crystallize it. Alternatively, the polysilicon can be directly deposited at a predetermined temperature.

The second conductive layer is made of a material layer that allows growth of HSG silicon on the surface thereof. As an example, amorphous silicon can be used. A planarization insulating layer is formed on the second conductive layer to fill the storage opening. The planarization insulating layer, and the second and first conductive layers, are etched until the sacrificial insulating layer is exposed, to form a storage node. The remainder of the planarization insulating layer in the storage opening and the sacrificial insulating layer are removed, to expose an inner surface and an outer surface of the storage node. The second conductive layer defines the inner surface and the first conductive layer defines the outer surface. HSG silicon is formed on the inner surface.

Forming the storage node opening comprises patterning the sacrificial insulating layer until the etching stopper layer is exposed, selectively etching the sacrificial insulating layer with respect to the etching stopper layer, to enlarge the dimension of the opening, and patterning the exposed etching stopper layer until the storage contact plug is exposed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
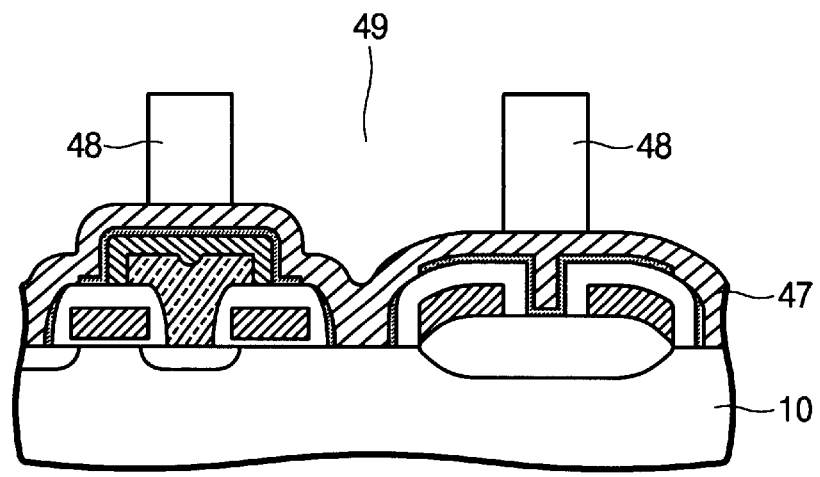
FIGS. 1A to 1J are cross-sectional views of a semiconductor substrate, at selected stages of a prior art cylindrical capacitor fabrication process.
Figure 1B:
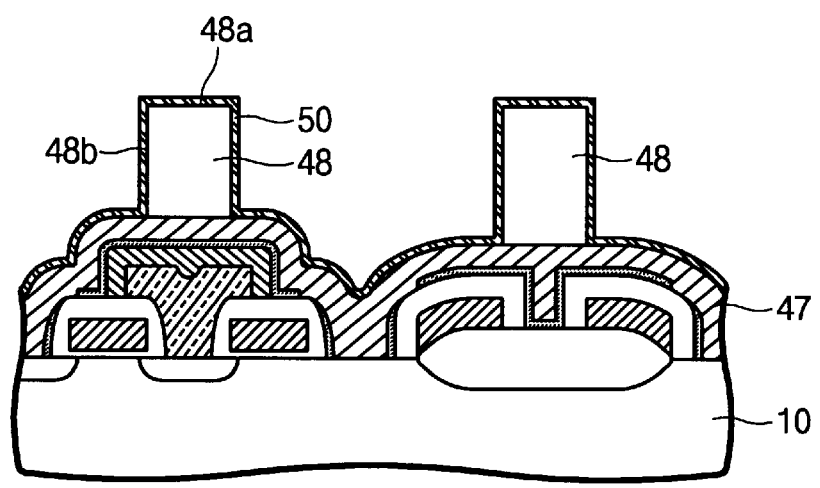
Figure 1C:
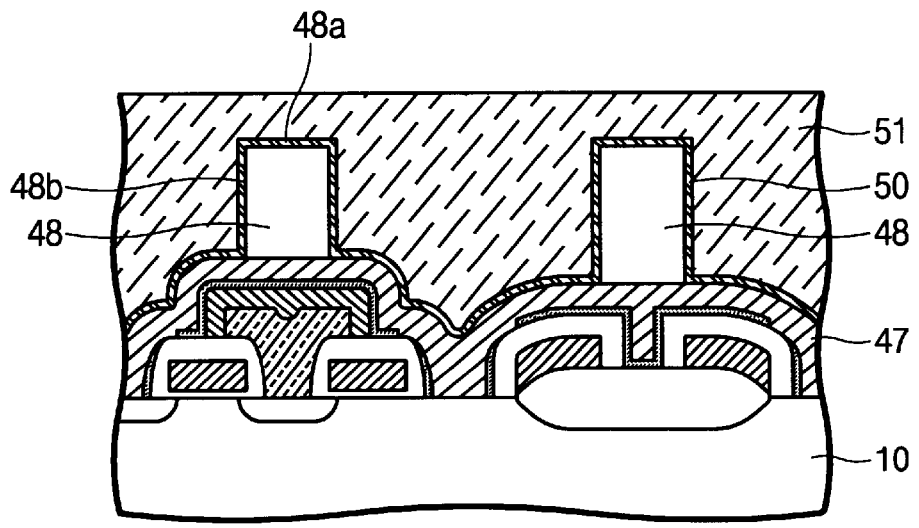
Figure 1D:
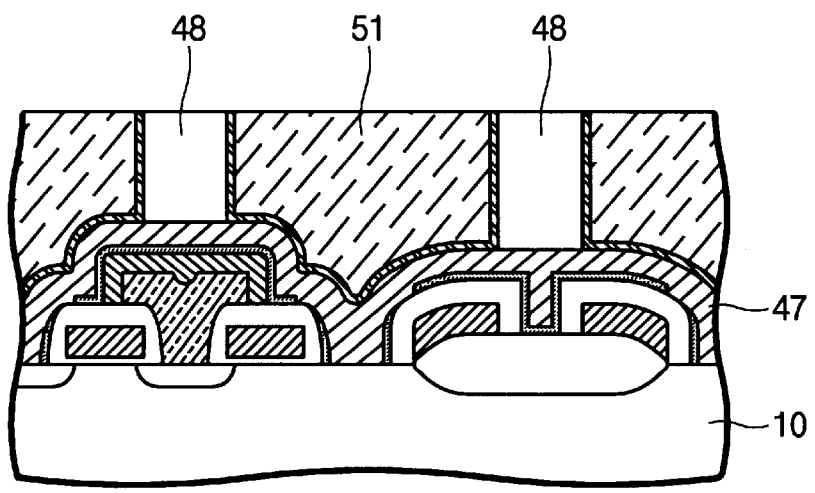
Figure 1E:
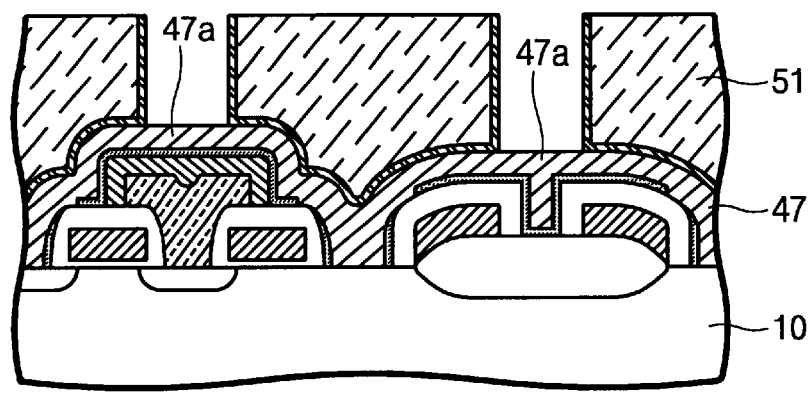
Figure 1F:
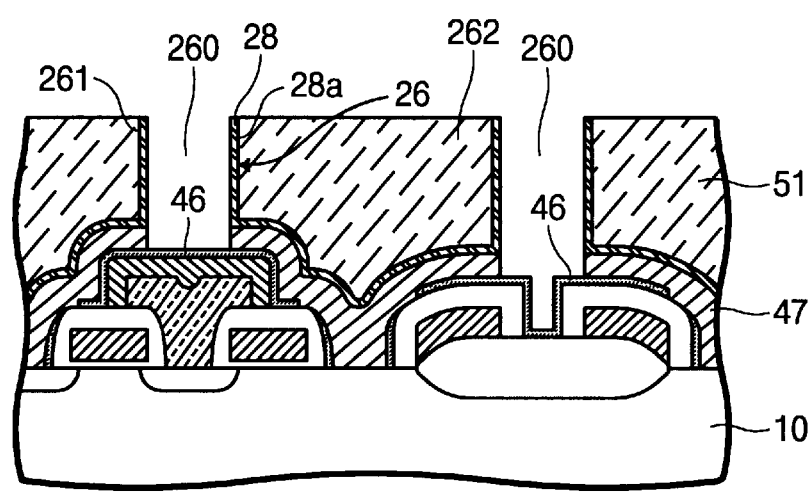
Figure 1G:
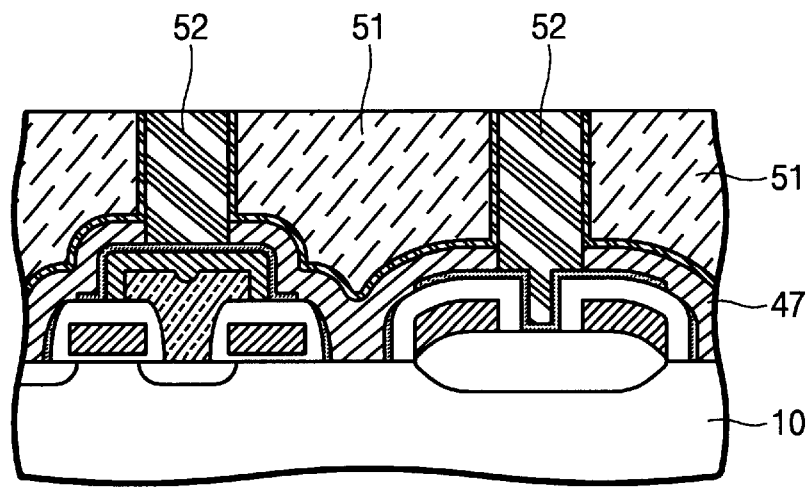
Figure 1H:
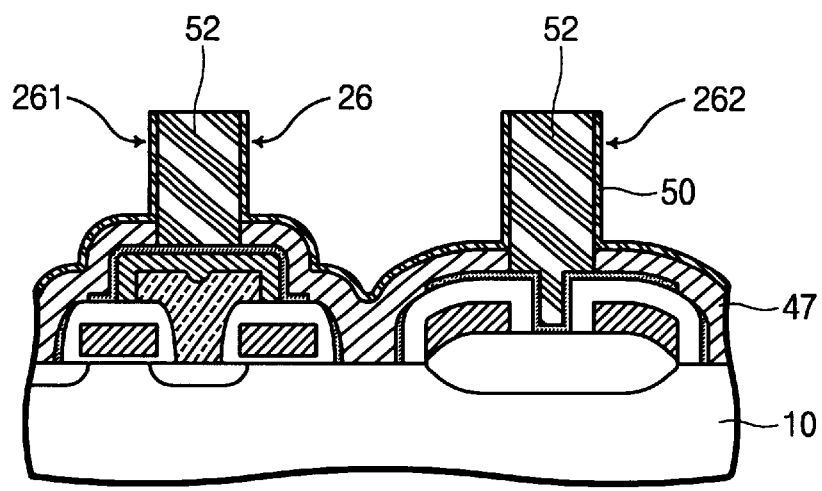
Figure 1I:
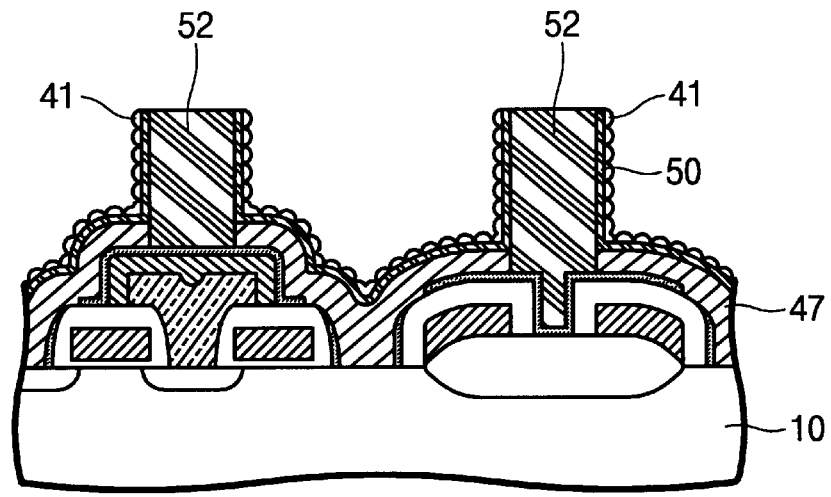
Figure 1J:
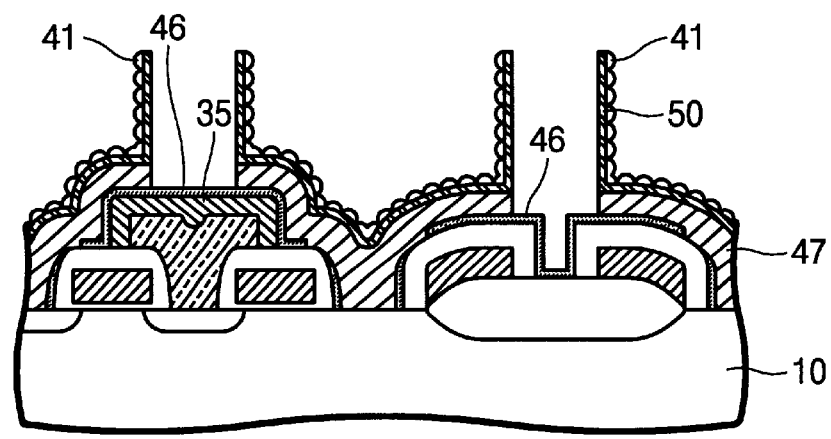

The present invention will now be described more fully hereinafter with reference to the accompanying drawings, in which preferred embodiments of the invention are shown. In the drawings, the thickness of layers and regions are exaggerated for clarity. It will also be understood that when a layer is referred to as being "on" another layer or substrate, it can be directly on the other layer or substrate or intervening layers may also be present. Moreover, each embodiment described and illustrated herein applies for the complementary conductivity type embodiment as well.

The present invention is related to a capacitor storage node and a method of fabricating thereof. Accordingly, the process for forming a field oxide layer and the field effect transistor structure as presently practiced in semiconductor manufacturing are only briefly described in order to better understand the current invention.

Figure 2:
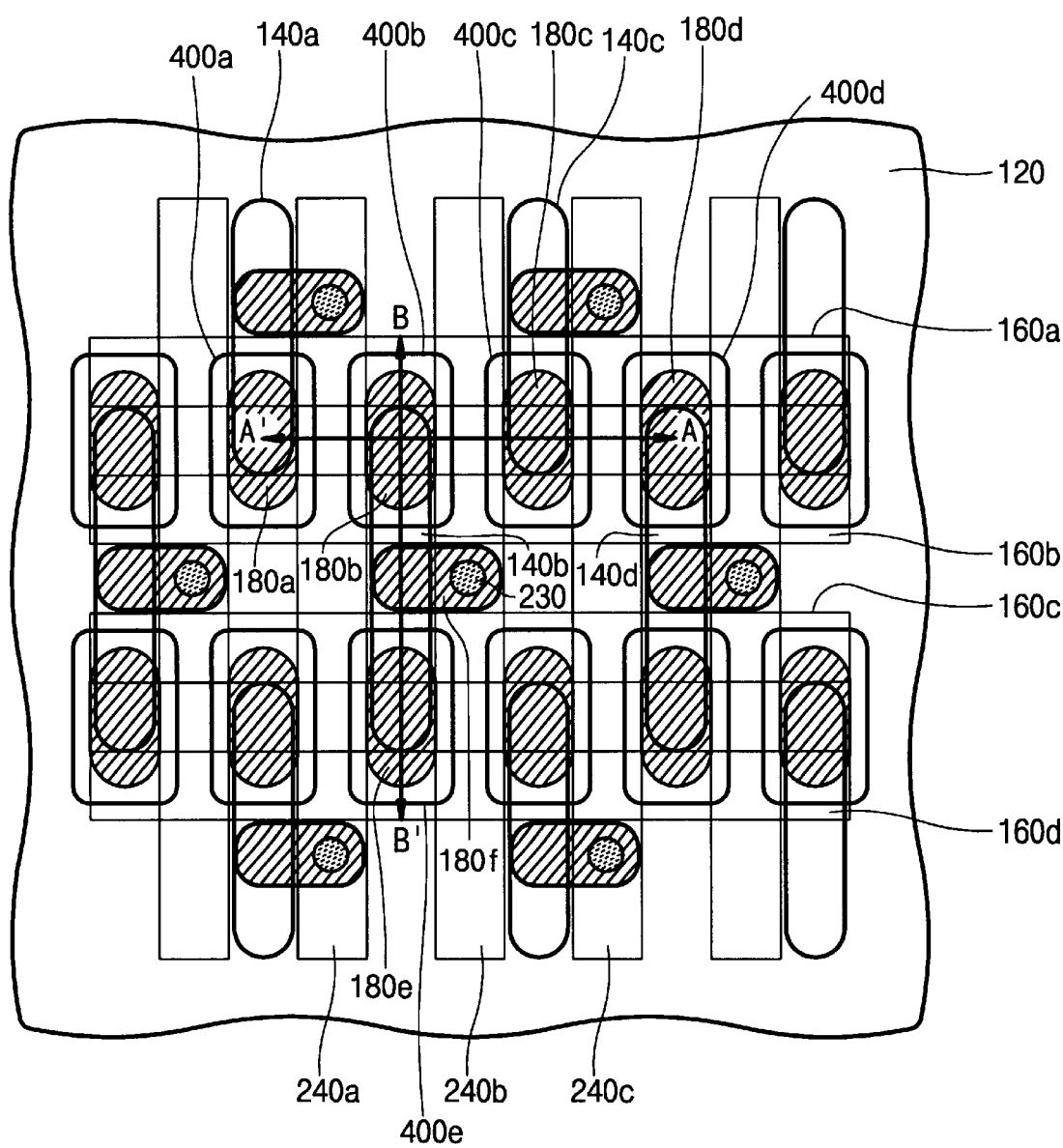
FIG. 2 is a top plan view of a semiconductor substrate where a cylindrical opening is formed in accordance with a first embodiment of the present invention.

FIG. 2 schematically shows a top plan view of a semiconductor substrate having a plurality of openings for storage nodes. More particularly, a plurality of active regions 140a–d are defined by a device isolation region 120. Only nine active regions are shown in the drawing but four of them are identified with a reference number. A plurality of transistors 160a–d, i.e., word lines that run parallel with the 3—3 reference line, and which intersect the active regions. A plurality of bit lines 240a–c are denoted and run outside of the active regions, in parallel with reference line 4—4 and intersecting the transistors. The bit lines are electrically connected to predetermined regions of the active regions through bit line contacts and bit line contact pads. For example, the bit line 240b is electrically connected to a predetermined region of the active region 140b through the bit line contact 230 and underlying bit line contact pad 180f. Though not shown in the drawing, the transistors and the bit lines are electrically separated through an insulator that is formed therebetween. The plurality of storage node openings 400a–e expose a plurality of storage contact pads 180a–e that are formed outside of the transistors in the active regions.

FIGS. 3A to 3J and FIGS. 4A to 4J are cross-sectional views of a semiconductor substrate, at selected stages of a method of fabricating a capacitor storage node in Ad accordance with a first embodiment of the present invention, respectively taken along lines 3—3 and 4—4 of FIG. 2. Now the method of fabricating a capacitor storage node will be fully described.

Figure 3A:
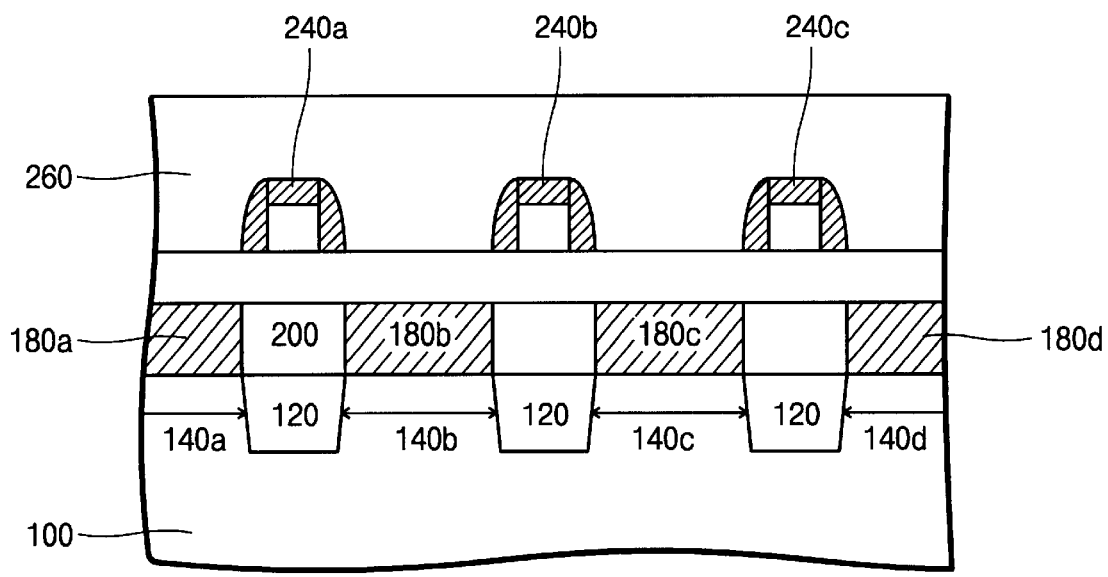
FIGS. 3A to 3J are cross-sectional views of the semiconductor substrate taken along line 3—3 of FIG. 2, at selected stages of the cylindrical capacitor fabrication process, in accordance with the first embodiment of the present invention.
Figure 4A:
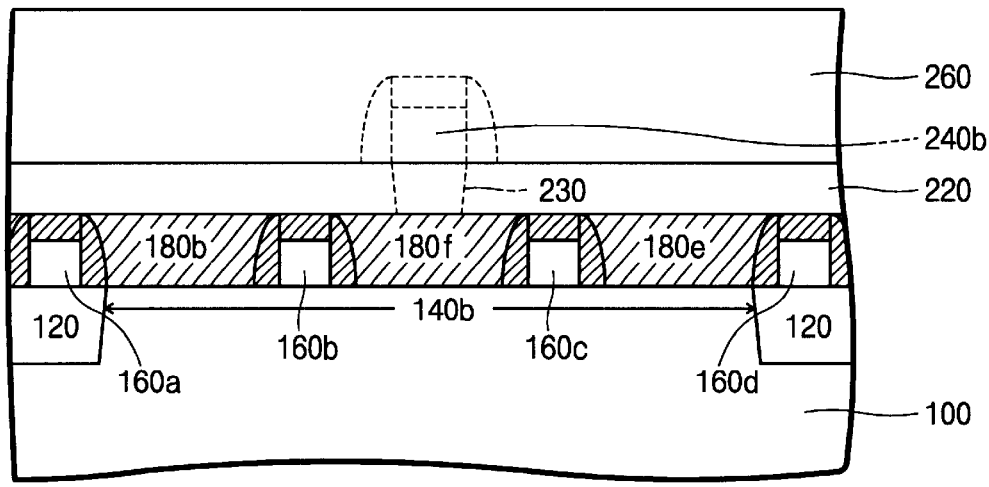
FIGS. 4A to 4J are cross-sectional views of the semiconductor substrate taken along line 4—4 of FIG. 2, at selected stages of the cylindrical capacitor fabrication process, in accordance with the first embodiment of the present invention.

Referring now to FIG. 3A and 4A, a semiconductor substrate 100 is provided. A device isolation region 120 is formed at a predetermined portion of the substrate 100, defining a plurality of rod-like active regions 140a–d. The device isolation region 120 can be formed by STI(Shallow Trench Isolation) or LOCOS(LOCal Oxidation of Silicon) techniques. After defining the active regions 140a–d, conventional ion implantation processes for well formation (not shown in the figures) and threshold voltage adjusting are carried out on the active regions. After that, a plurality of transistors 160a–d, i.e., word lines are formed conventionally to intersect the active regions. As is well known, each transistor is composed of a gate pattern, a sidewall spacer and source/drain regions outside of the gate pattern. The gate pattern includes a gate oxide, a gate electrode and a gate capping layer. The gate capping layer is preferably made of silicon nitride.

Contact pad processing is carried out to improve the photolithography margin. An insulator is deposited on the resulting structure having the transistors, and then the insulator is planarized to form a planarized insulating layer 200. The planarized insulating layer 200 is preferably made of a silicon oxide. Through photolithography and an etching process, the planarized insulating layer 200 is patterned to form an opening exposing the source/drain regions. Then the opening is filled with a conductive material such as doped polysilicon to form a plurality of contact pads 180a–e.

The next process sequence is the formation of a bit line. A first insulating layer 220 is formed on the resulting structure having the contact pads 180a–d. Through photolithography and an etching process, the first insulating layer 220 is patterned to form a bit line contact hole 230, exposing a desired contact pad 180f. A conductive material and a bit line capping layer are sequentially formed on the first insulating layer 220 and in the bit line contact hole 230, and patterned to form a plurality of bit line patterns 240a–c. Each bit line pattern is composed of a bit line being in contact with desired contact pads, and a bit line capping pattern formed on the bit line. For example, the bit line pattern 240b is electrically connected to the contact pad 180f. Sidewall spacers are formed on sidewalls of the bit line pattern. More particularly, the bit line is made of a multilayer structure of titanium/titanium nitride/tungsten. The titanium and titanium nitride are a so called barrier layer interposed between the tungsten and the contact pad. The titanium is formed to a thickness of about 750 angstroms and the titanium nitride is formed to a thickness of about 250 angstroms. The tungsten is formed to a thickness of about 800 angstroms. The bit line capping layer and spacer are made of a material that has an etching selectivity with respect to a later-formed silicon oxide layer. Preferably, they are made of silicon nitride. The capping silicon nitride is formed to a thickness of about 1,000 angstroms to 2,000 angstroms and the spacer silicon nitride is formed to a thickness of about 300 angstroms to 700 angstroms. The capping and spacer silicon nitride layer serve to protect the bit line during subsequent etching processes for storage node opening. After forming the bit line pattern, a planarized second insulating layer 260 is formed on the resulting structure, to a thickness of about 1,000 angstroms. Preferably, the second insulating layer 260 is made of a silicon oxide.

Figure 3B:
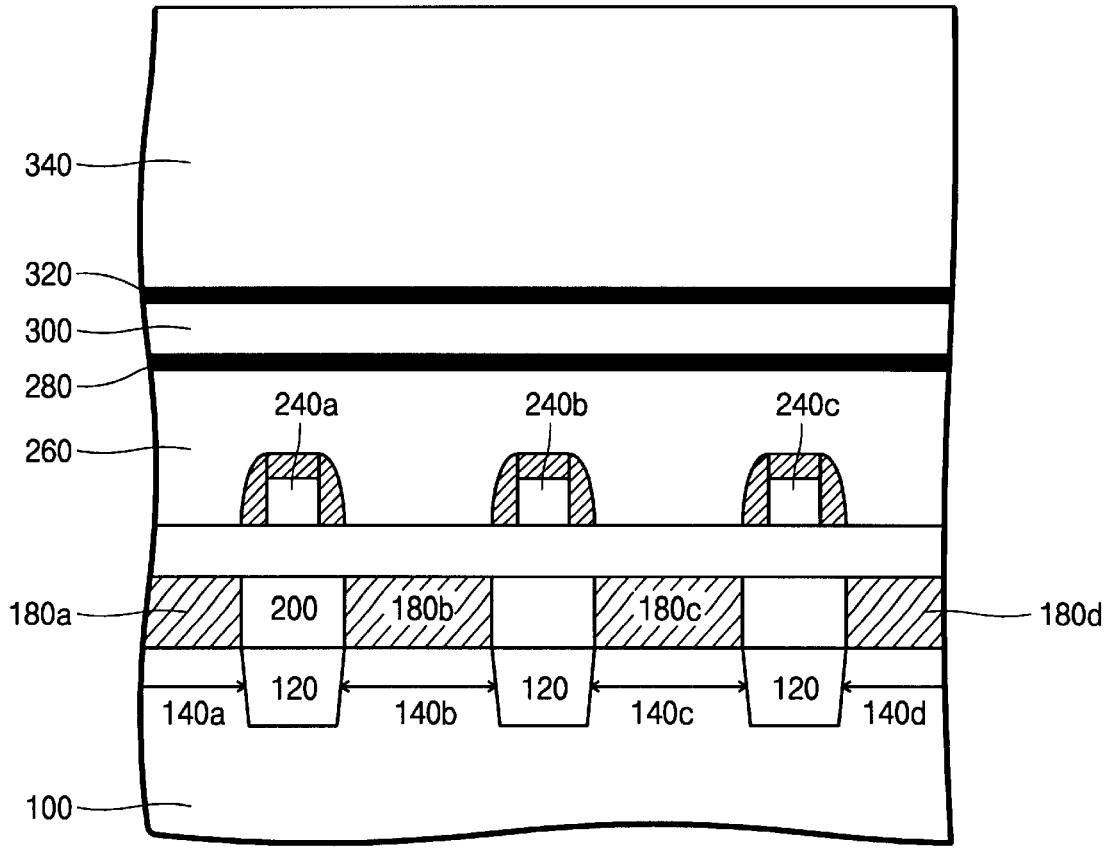
Figure 4B:
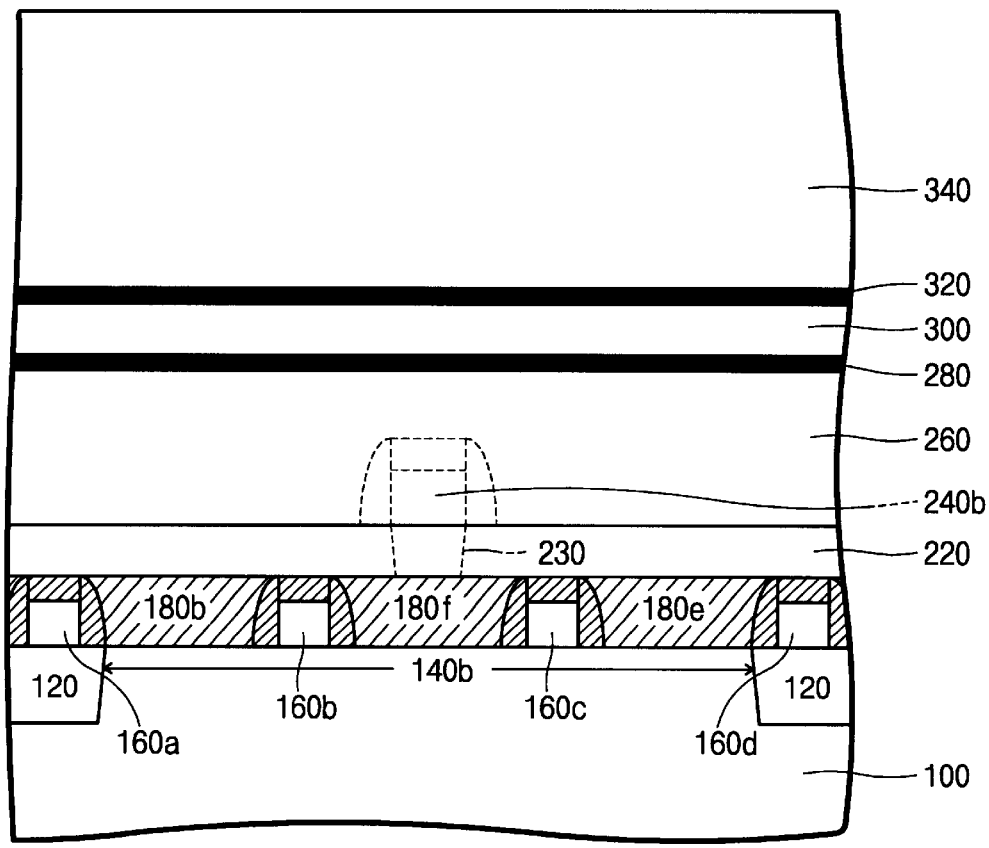

Referring now to FIGS. 3B and 4B, a third insulating layer 280 is formed on the second insulating layer 260 to prevent the oxidation of the bit line during capacitor dielectric processes. The third insulating layer 280 is preferably made of a silicon nitride with a thickness of about 70 angstroms to 150 angstroms. A fourth insulating layer 300 is then formed on the third insulating layer 280. The fourth insulating layer 300 is preferably made of silicon oxide with a thickness of about 500 angstroms to 1,000 angstroms. An etch stopper layer 320 is formed on the fourth insulating layer 300. The etch stopper layer 320 is preferably made of silicon nitride with a thickness of about 200 angstroms to 1,000 angstroms. The etch stopper layer 320 serves as an end point during a subsequent etching process for formation of a storage opening. A fifth insulating layer 340, i.e., sacrificial oxide layer, is formed on the etch stopper layer 320 to determine the height of the storage node. For example, the sacrificial oxide layer 340 is formed to a thickness of about 8,000 angstroms to 12,000 angstroms.

Figure 3C:
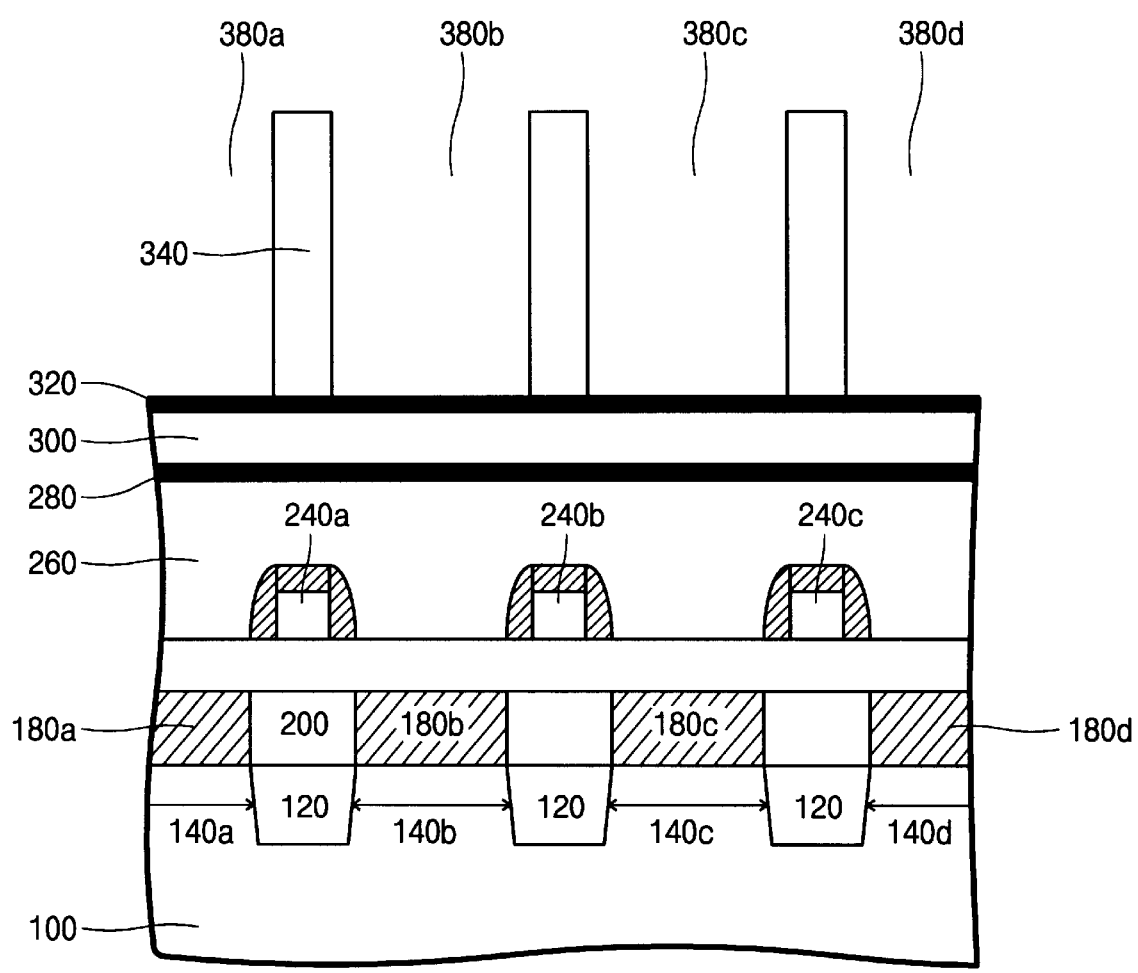
Figure 3D:
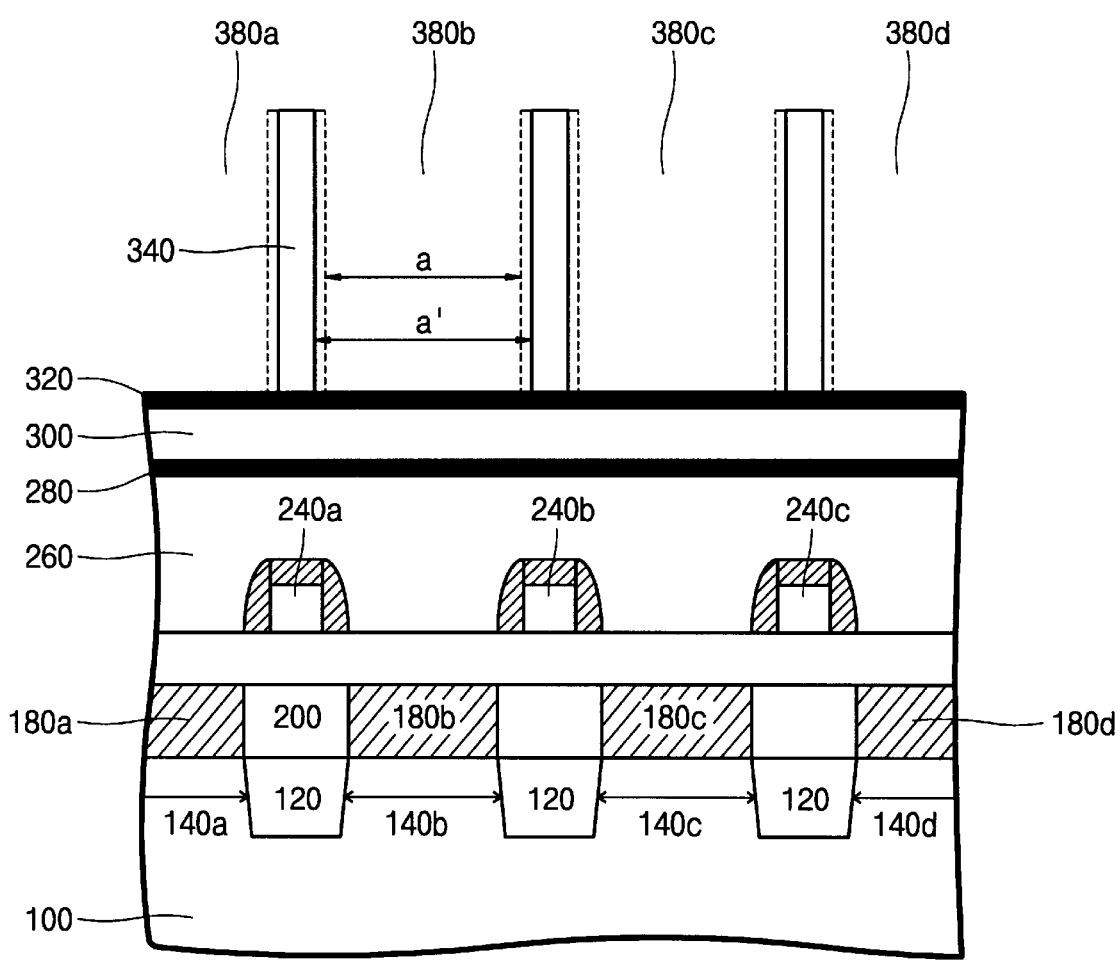
Figure 4C:
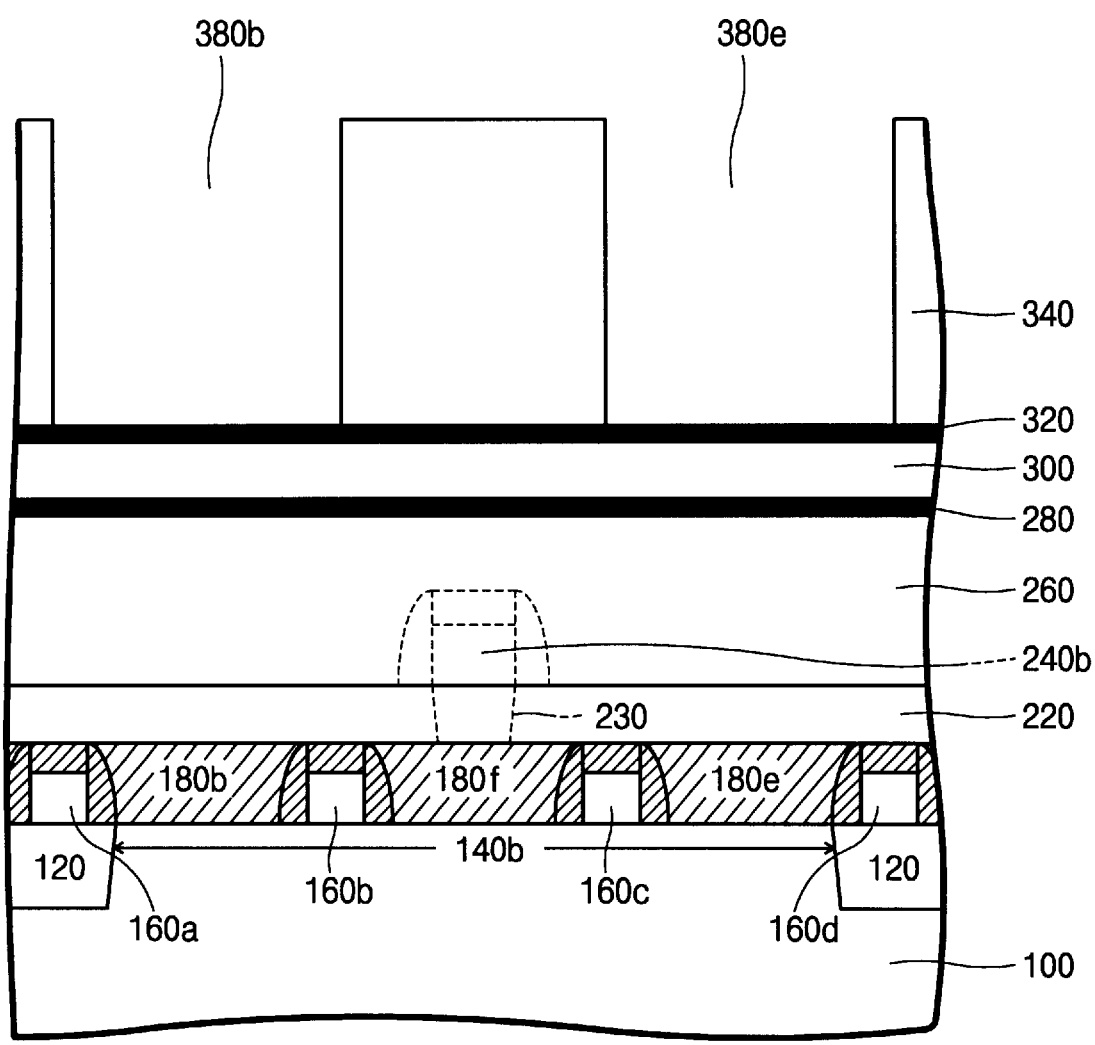
Figure 4D:
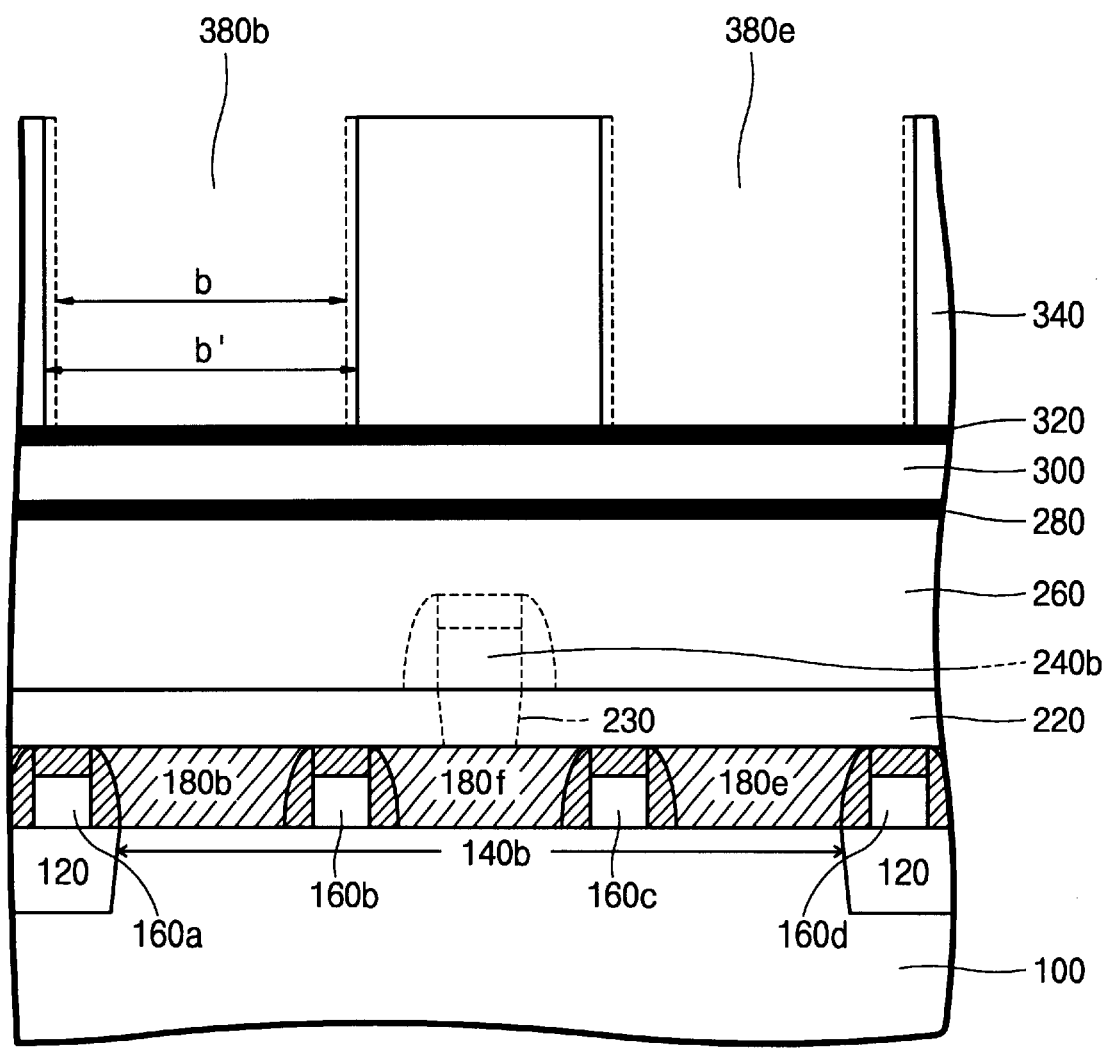

A photoresist layer(not shown) is spin coated on the sacrificial oxide layer 340 and patterned into a predetermined configuration. Using the patterned photoresist layer, underlying sacrificial oxide layer 340 is anisotropically etched to form a plurality of first storage node openings 380a–e, as shown in FIGS. 3C and 4C. During this etching process, the etch stopper layer 320 serves as an end point. The sacrificial oxide layer 340 having a plurality of first storage node openings 380a–e can be further etched to enlarge the first storage node opening aperture. Preferably wet etching using conventional oxide etchant is carried out to enlarge the first storage node opening dimension from "a" to "a'" and from "b" to "b'" as shown in FIGS. 3D and 4D. At this time, bottom and top portions of the first storage node opening are not etched since the etch stopper and the patterned photoresist layer protects the bottom and top portions respectively. The distance between adjacent storage node openings that is defined by design rule, can be decreased due to above-mentioned wet etching.

Figure 3E:
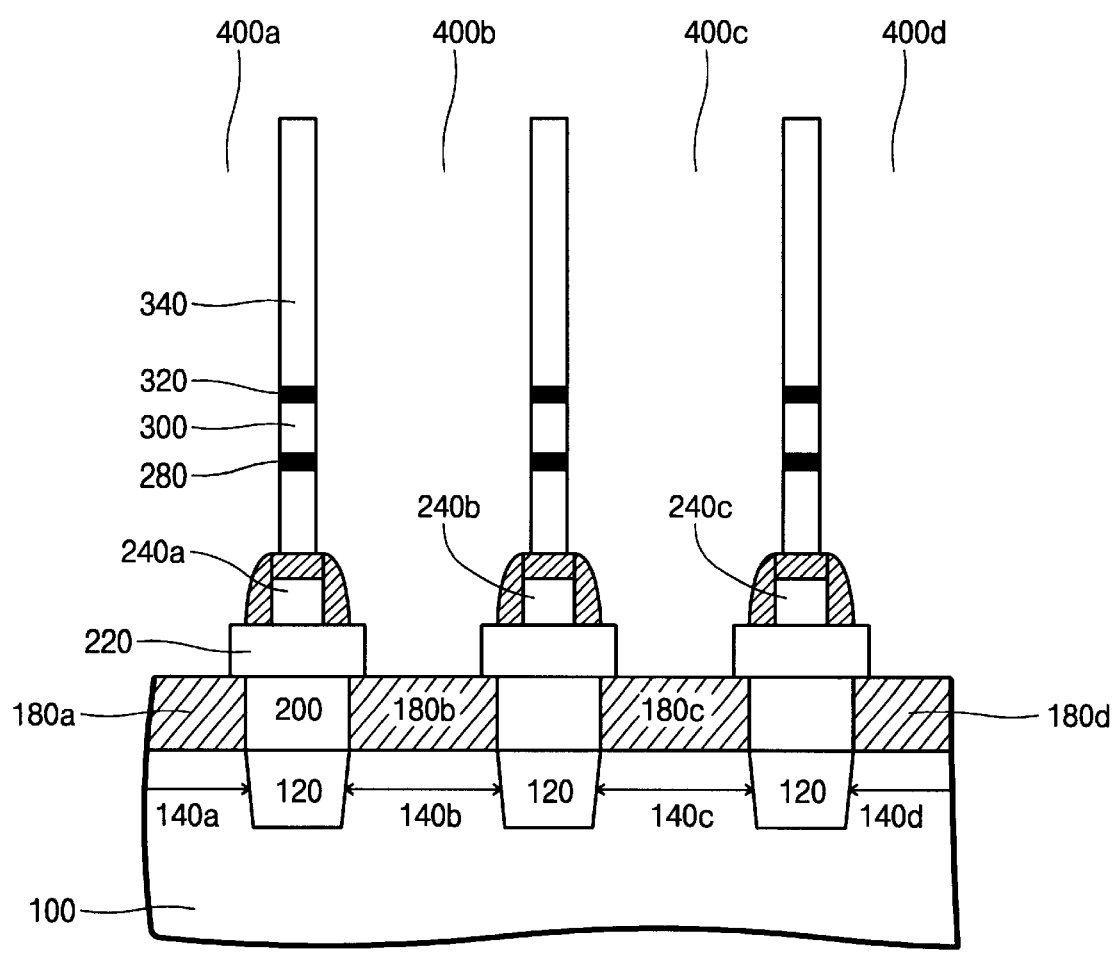
Figure 4E:
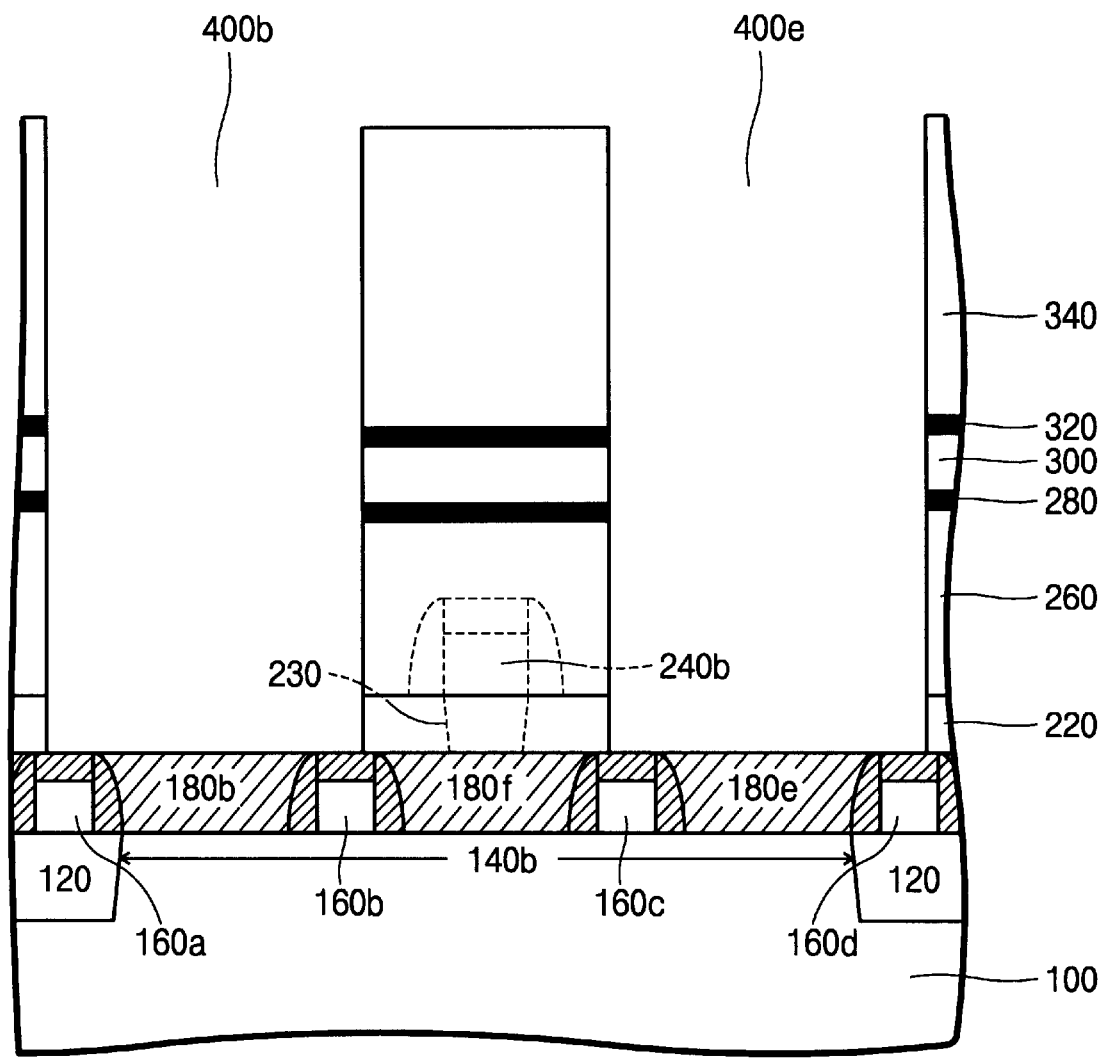

Referring now to FIGS. 3E and 4E, after enlarging the first storage node openings, exposed etch stopper nitride layer 320 is anisotropically etched. In subsequent processes, the fourth insulating oxide layer 300 is etched selectively with respect to the third insulating nitride layer 280, and then the third insulating nitride layer 280 is etched selectively with respect to the underlying second insulating oxide layer 260. The second insulating oxide layer 260 protects the bit line capping and spacer nitride layer when the third insulating nitride layer 280 is etched. The second and first insulating oxide layers 260 and 220 between a bit line and an adjacent bit line are selectively etched with respect to the bit line capping and spacer nitride layer, to form a plurality of second storage contact openings. Namely, the silicon nitride bit line spacer and capping layer prevent the bit line from being exposed by the storage contact opening in the process of etching the oxide layer. The second and first insulating oxide layers 260 and 220 are etched using a CF based gas, so as to have high oxide selectivity with respect to the nitride of the bit line capping and spacer layer. The second storage contact openings are self-aligned to the plurality of first storage openings and expose the contact pads 180a–e. Namely, as shown in FIGS. 3E and 4E, openings 400a–e for storage node and storage contact are formed simultaneously through a single photolithography process. Accordingly, misalignment between storage node openings and storage contact openings does not happen.

After completing storage openings 400a–e, a storage node formation process is carried out. According to the present invention, the storage node is made of a double layer structure composed of first and second conductive layers 420 and 440 sequentially formed in the storage openings. The first conductive layer 420 is made of a material that suppresses growth of HSG silicon thereon, and the second conductive layer 440 is made of a material on which HSG silicon is easily grown. As an example, the first conductive layer 420 can be crystallized silicon (polysilicon) and the second conductive layer 440 can be amorphous silicon.

Figure 3F:
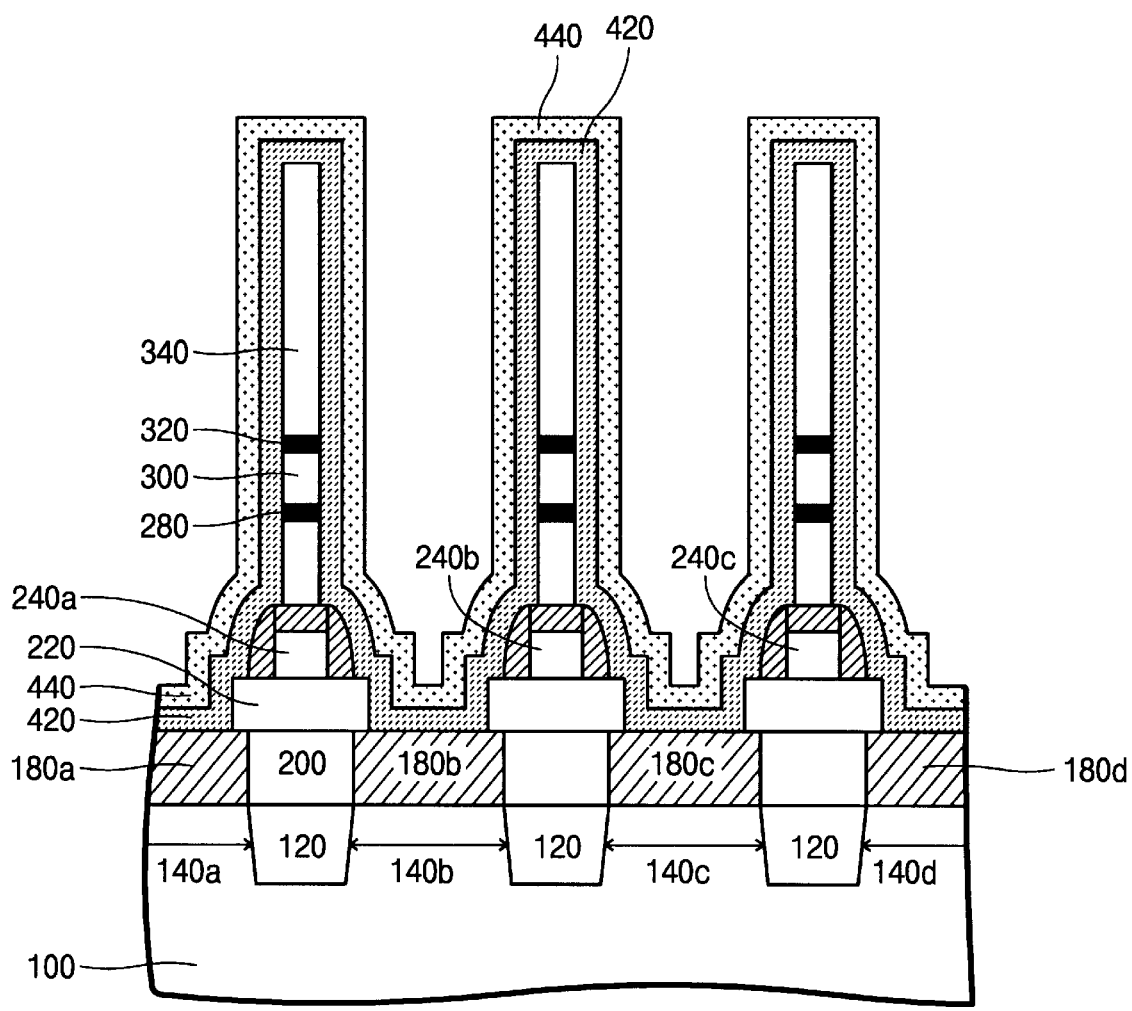
Figure 4F:
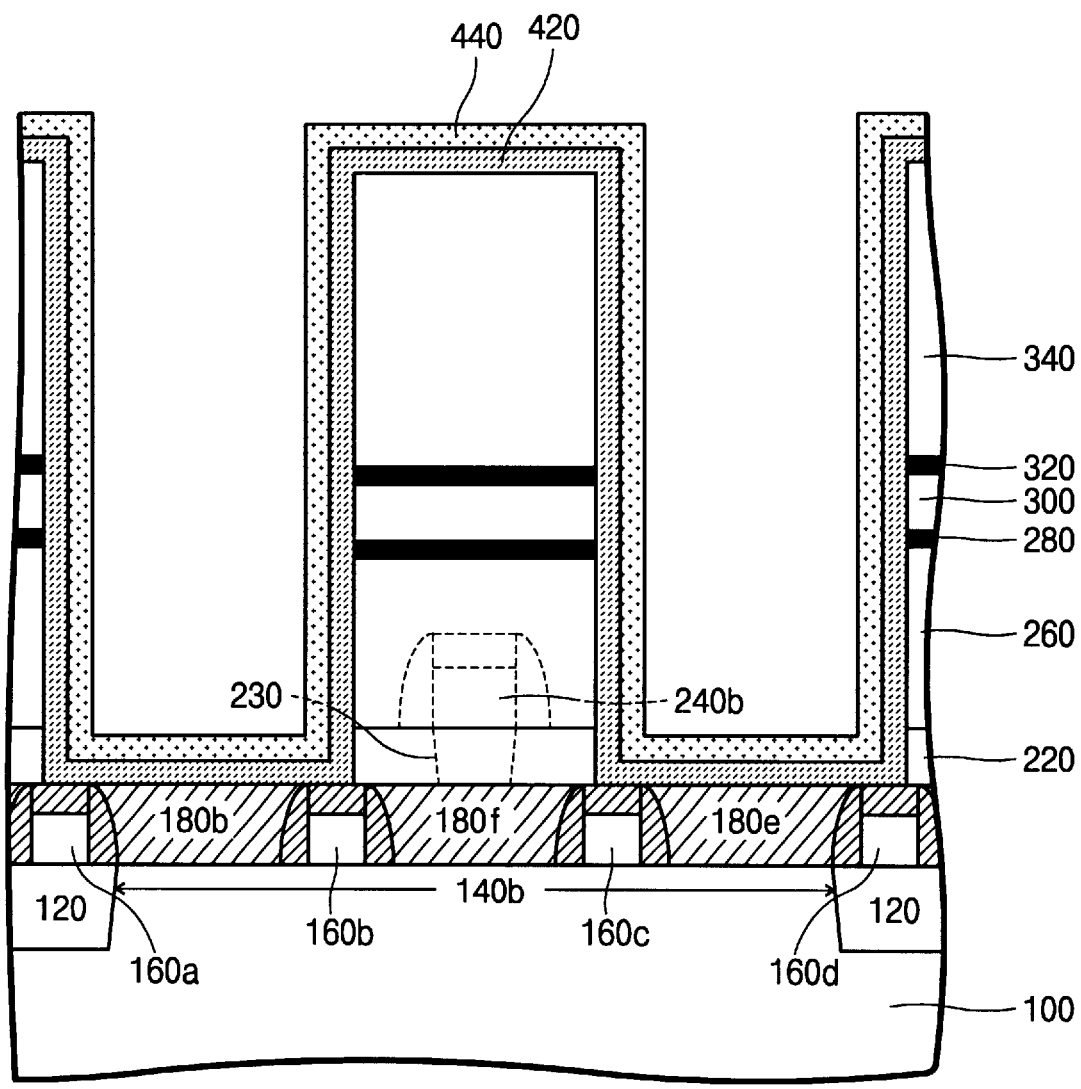

More particularly, referring to FIGS. 3F and 4F, a first conformal amorphous silicon is deposited on the resulting structure shown in FIGS. 3E and 4E to a thickness of about 100 angstroms to 300 angstroms. The first amorphous silicon is then annealed to be transformed into crystallized silicon, i.e., first conductive layer 420. The annealing is carried out at a temperature of about 650° C. for about 30 minutes. Then a second amorphous silicon layer 440 as the second conductive layer is deposited on the first crystallized silicon layer 420, to a thickness of about 200 angstroms to 400 angstroms. Alternatively, the first crystallized silicon can be formed by directly depositing polysilicon at a predetermined temperature.

Figure 3G:
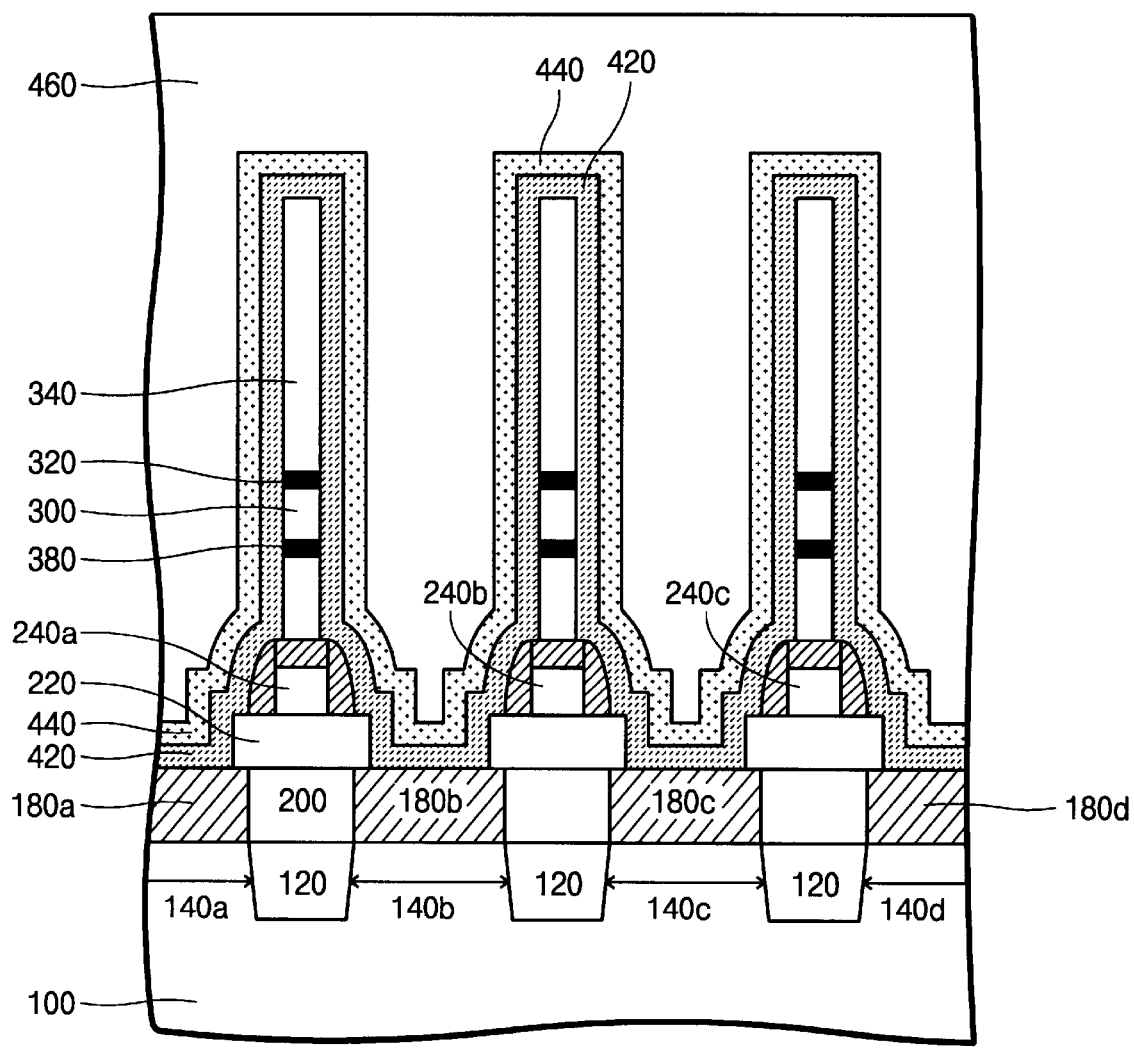
Figure 3H:
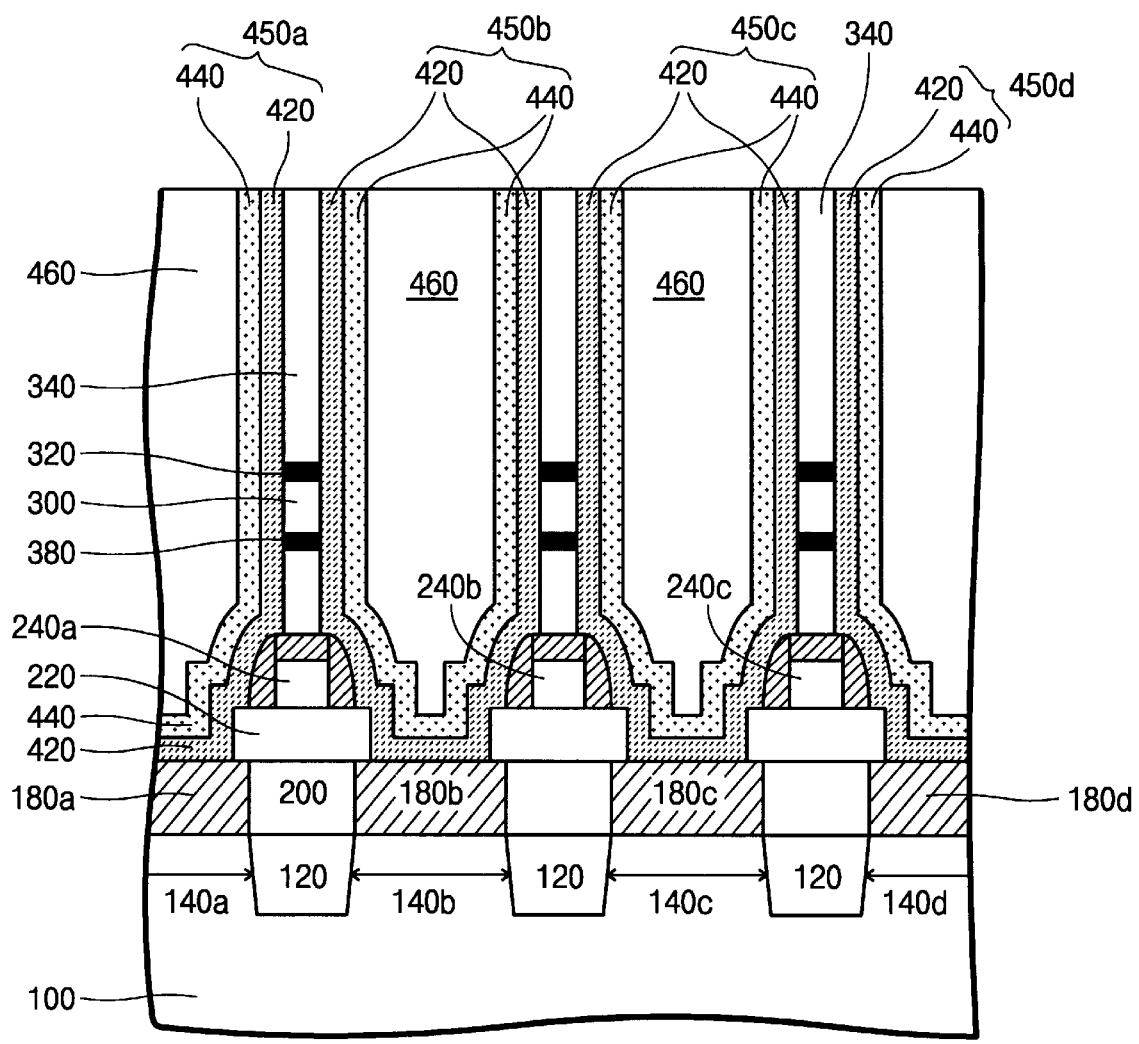
Figure 3I:
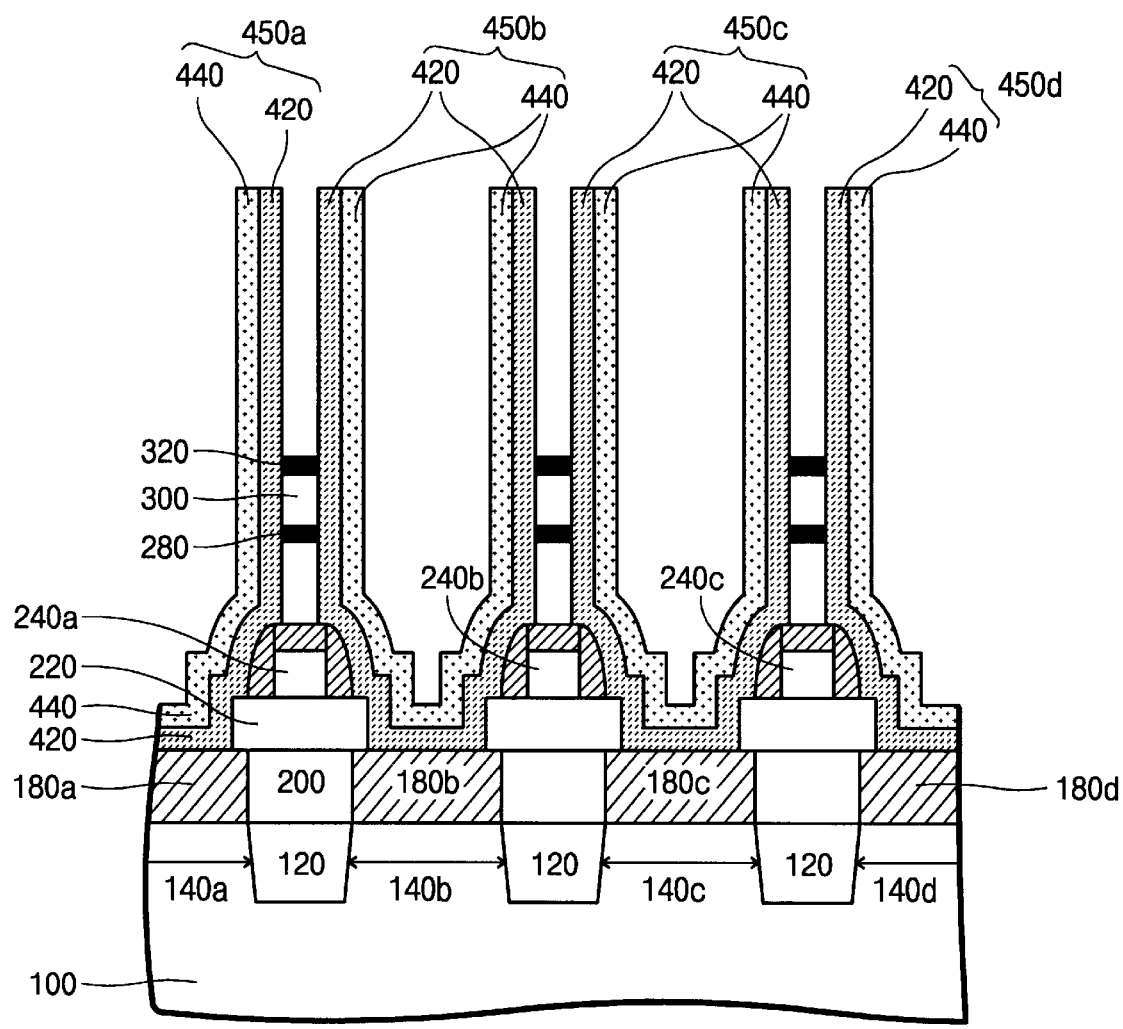
Figure 4G:
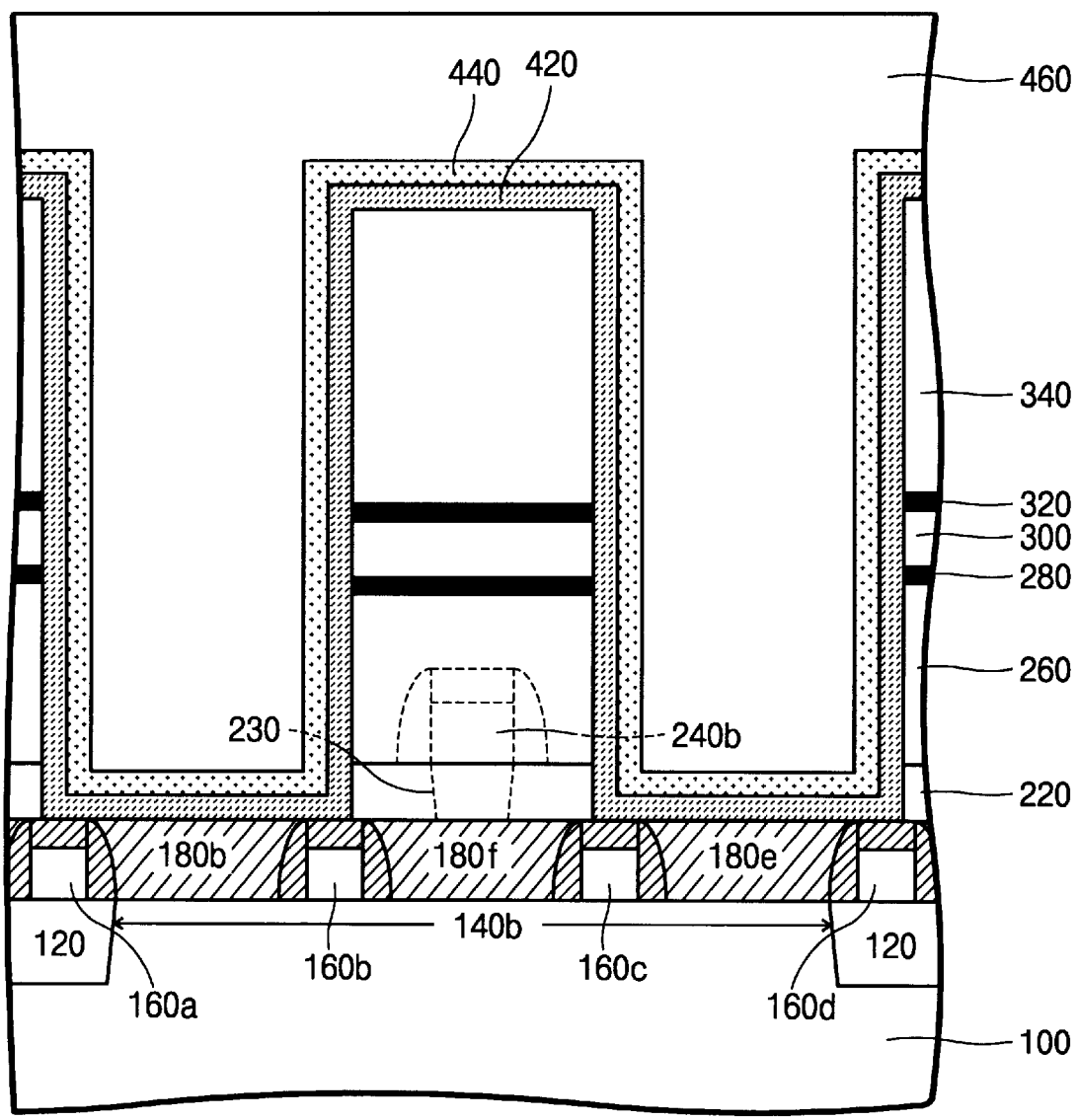
Figure 4H:
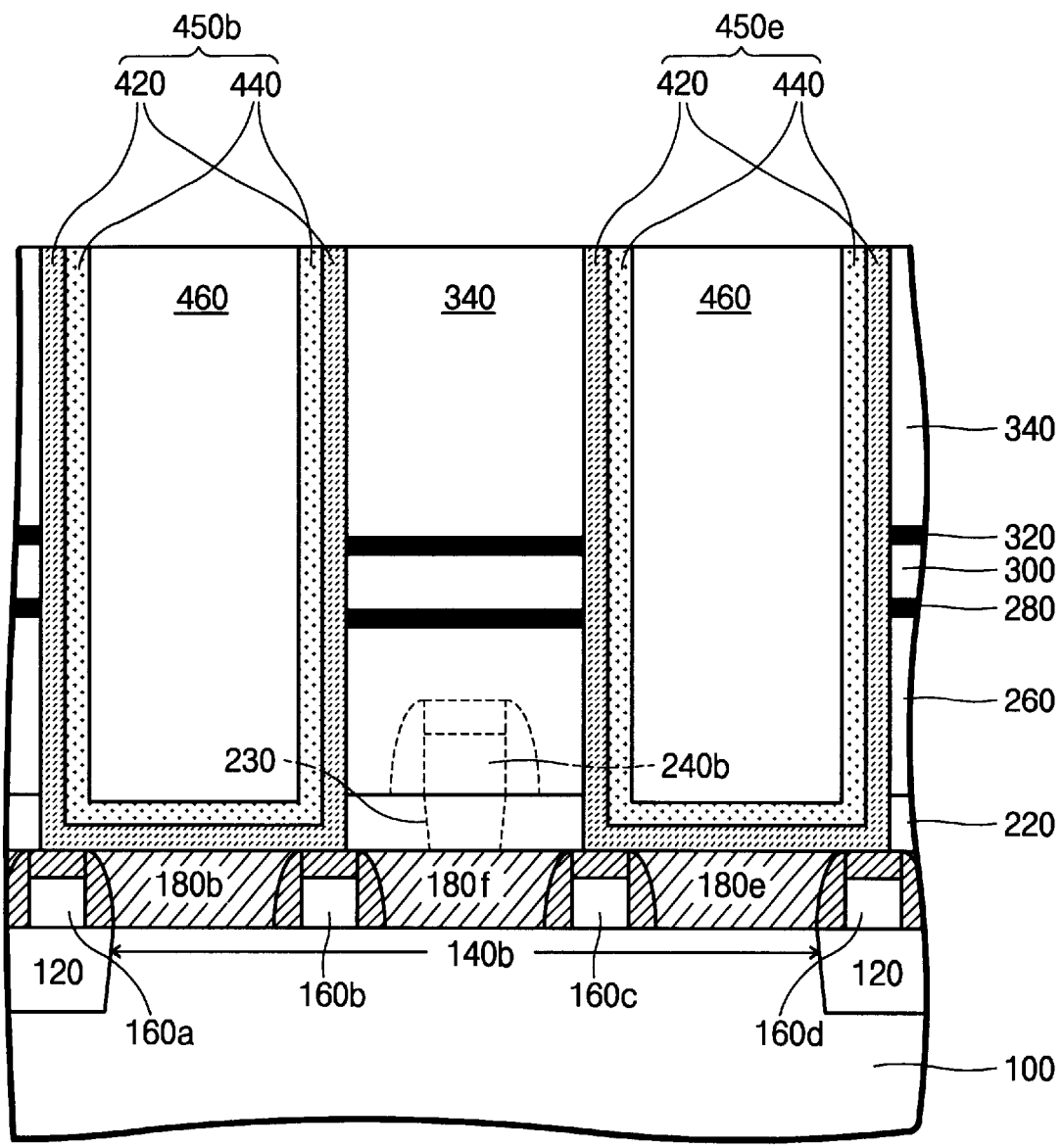

The next process sequence is to isolate each storage node by cell unit, as schematically shown in FIGS. 3G to 3I and 4G to 4I. Referring now to FIGS. 3G and 4G, a sixth insulating layer 460 is formed on the second amorphous conductive layer 440, filling the remainder of the storage openings. The sixth insulating layer 460 is made of a photoresist layer or an oxide such as SOG or undoped silicon glass. After that, a planarization process is carried out to isolate each storage node as shown in FIGS. 3H and 4H. Namely, the planarization process is carried out on the sixth insulating layer 460, and the second and first conductive layers 420 and 440, until the sacrificial oxide layer 340 is exposed, thereby leaving the first and second conductive layers and the sixth insulating layer 460 in the storage openings, thus forming storage nodes 450a–e of cylindrical shape. The planarization process can be performed by CMP or etch back.

Figure 4I:
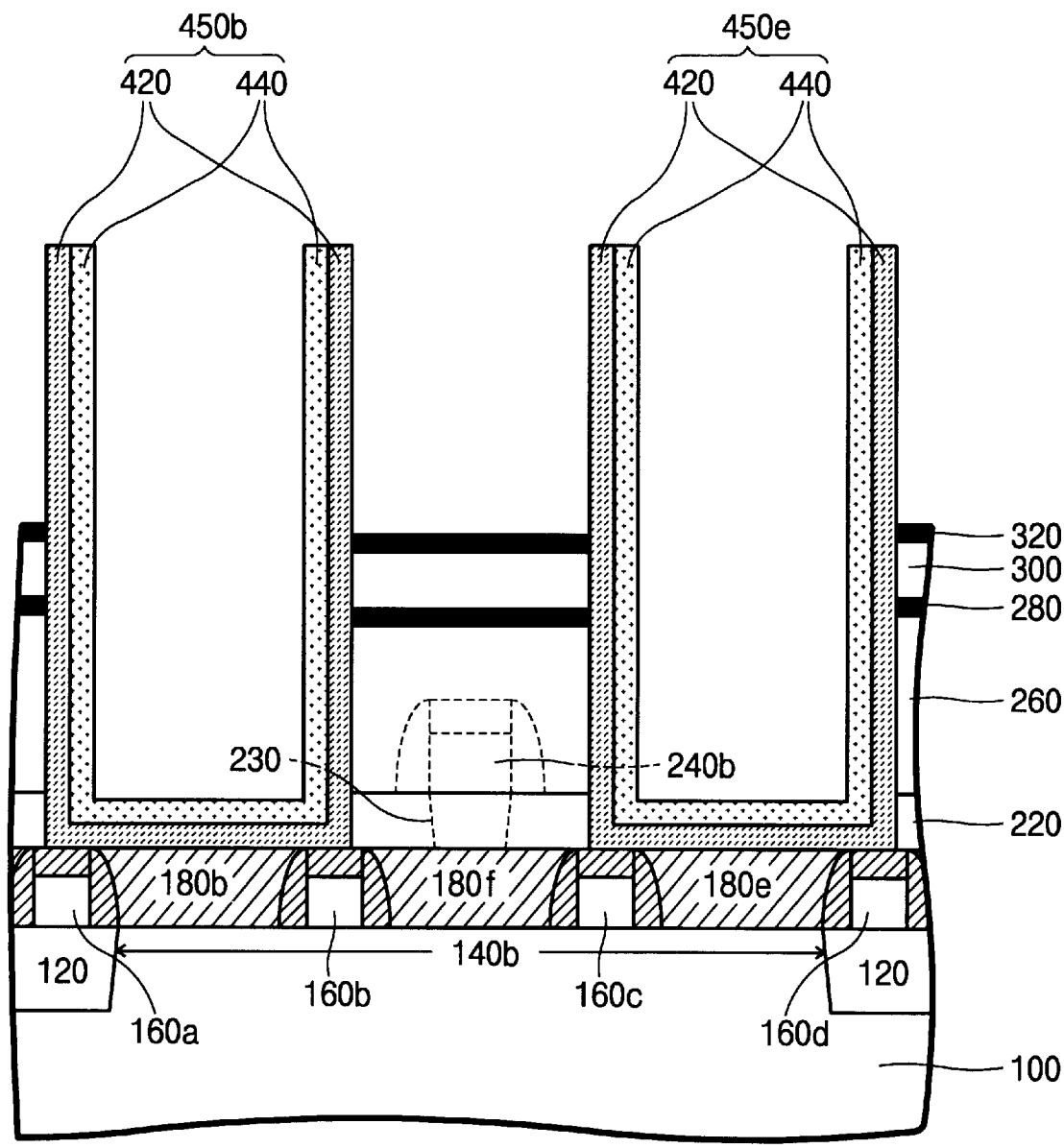

The remainder of sixth planarization layer 460 in the interior of the cylinders and the sacrificial oxide layer 340 exterior of the cylinders are removed, as shown in FIGS. 3I and 4I. Accordingly, inner walls of the cylindrical storage node, i.e., the second amorphous silicon 440 is exposed, and also outer walls of the cylindrical storage node, i.e., the first crystallized silicon 420 is exposed. More particularly, when a photoresist layer is used as the sixth planarization layer, the photoresist layer is first removed to expose the inner wall (second conductive layer) and then the sacrificial oxide layer is removed to expose the outer wall(first conductive layer). On the other hand, when the sixth planarization layer is made of an oxide, the planarization layer and the sacrificial oxide layer are simultaneously removed.

Figure 3J:
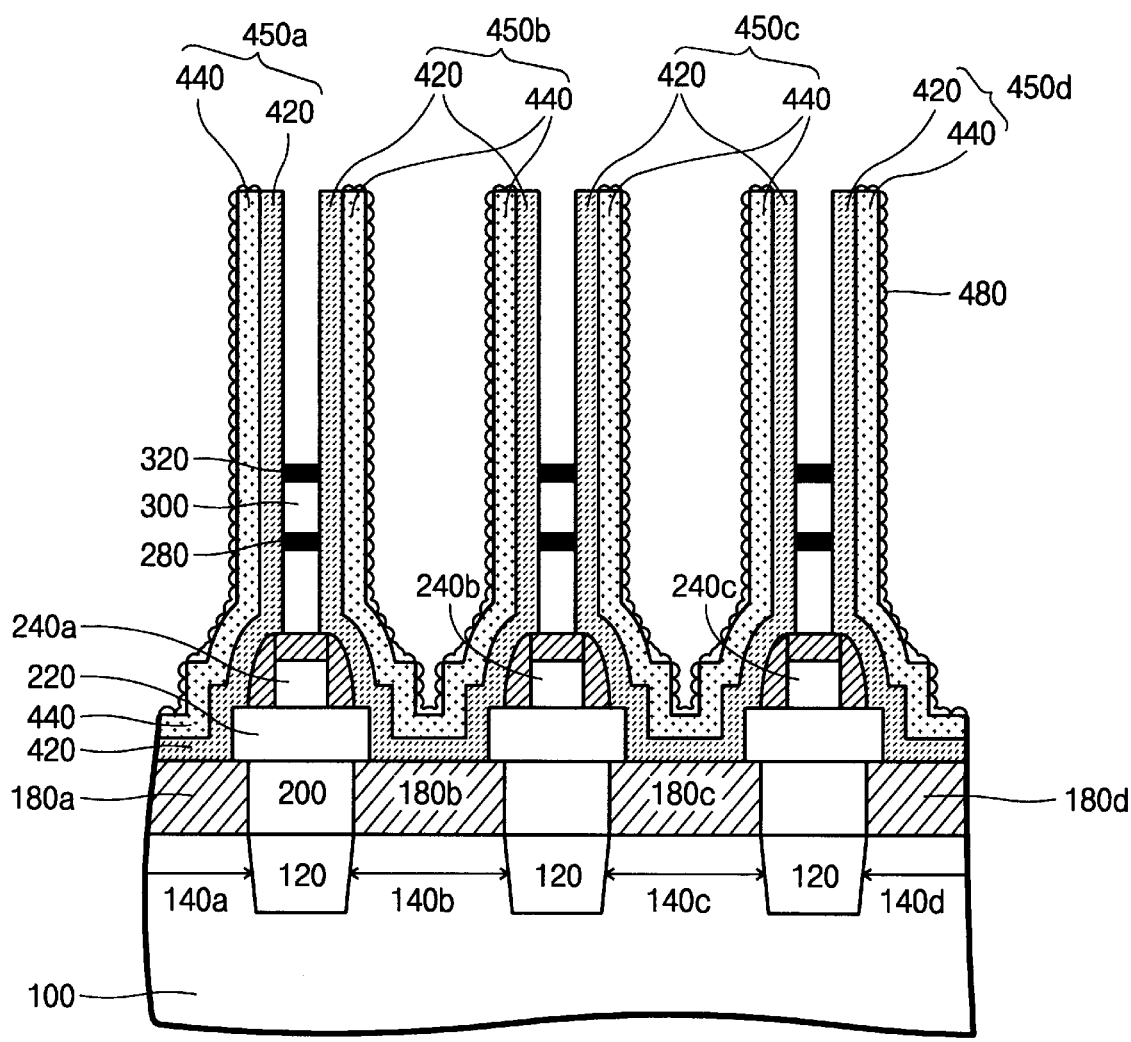
Figure 4J:
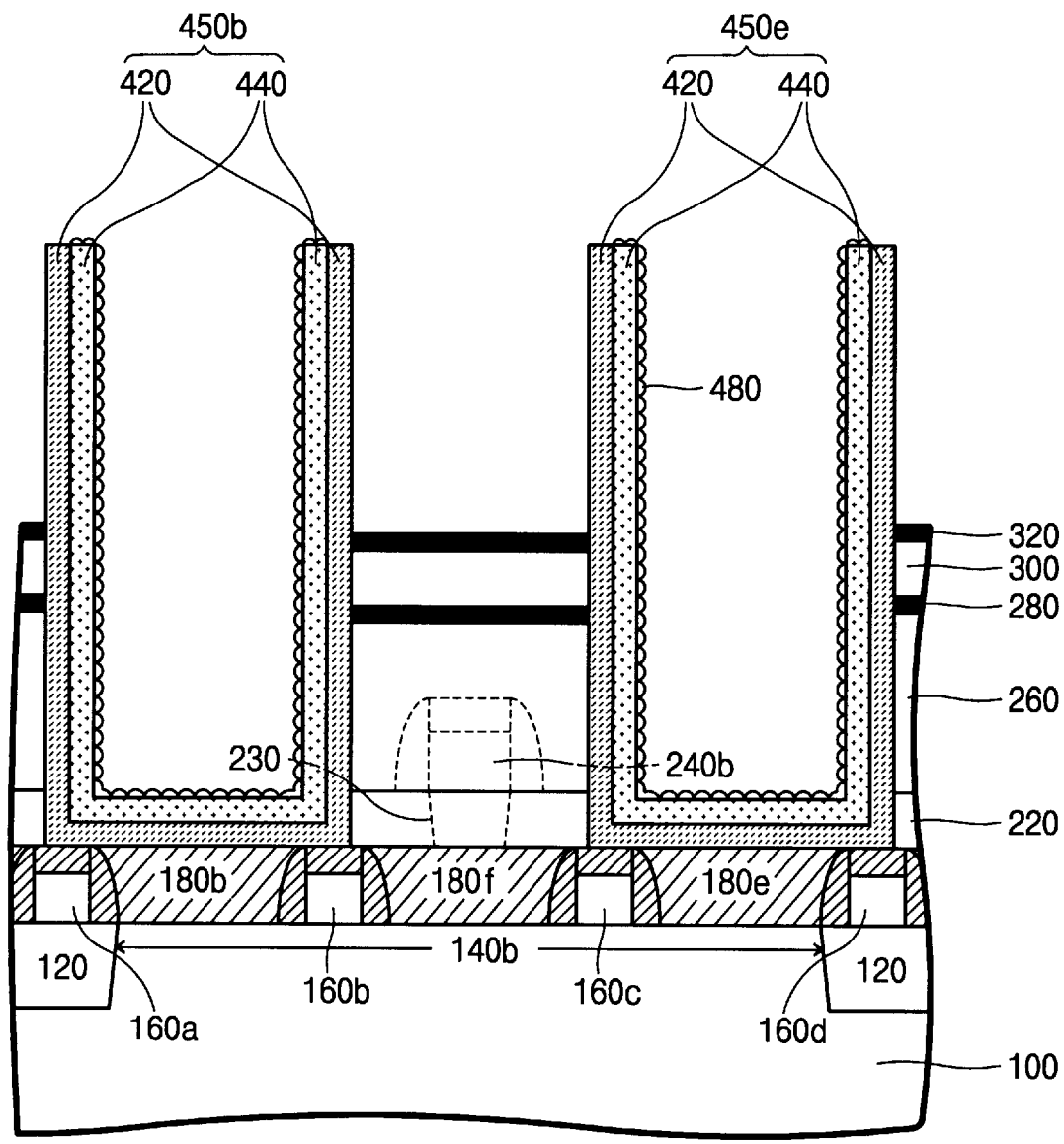

The next process sequence is the formation of HSG (hemispherical grain) silicon, as schematically shown in FIGS. 3J and 4J. Since the outer wall of the storage node is made of crystallized silicon 420 and the inner wall of the storage node is made of amorphous silicon 440, HSG silicon is formed only on the amorphous silicon, i.e., inner wall of the storage node. HSG silicon is formed conventionally. Namely, HSG seeds are formed using source gas such as $SiH_4$, and annealing is carried out to grow the HSG seeds to a desired sized, thereby forming HSG silicon.

According to the present invention, a storage node is made of a double layer. A first conductive layer defines the outer wall of the storage node and is made of crystallized silicon. A second conductive layer defines the inner wall of the storage node and is made of amorphous silicon. HSG silicon is formed after a sacrificial oxide layer is removed, and is formed only on inner wall, i.e., formed on the second layer. Accordingly, electrical bridges between adjacent storage nodes caused by HSG silicon can be prevented.

Subsequently, a capacitor dielectric process and a plate node process are conventionally carried out to form a cylindrical capacitor.

FIGS. 5A to 5J are cross-sectional views of a semiconductor substrate, taken along line 4—4 of FIG. 2 at selected stages of a method of fabricating a capacitor storage node in accordance with a second embodiment of the present invention.

Unlike in the first embodiment shown in FIGS. 3A to 3J and 4A to 4J, the second embodiment does not form the storage node opening and storage contact opening through a single photolithography process. Namely, after storage contact opening and the subsequent storage contact plug formation, storage node openings are formed to expose the storage contact plugs. The same parts and processings as in the first embodiment are simply described hereinafter as appropriate.

Figure 5A:
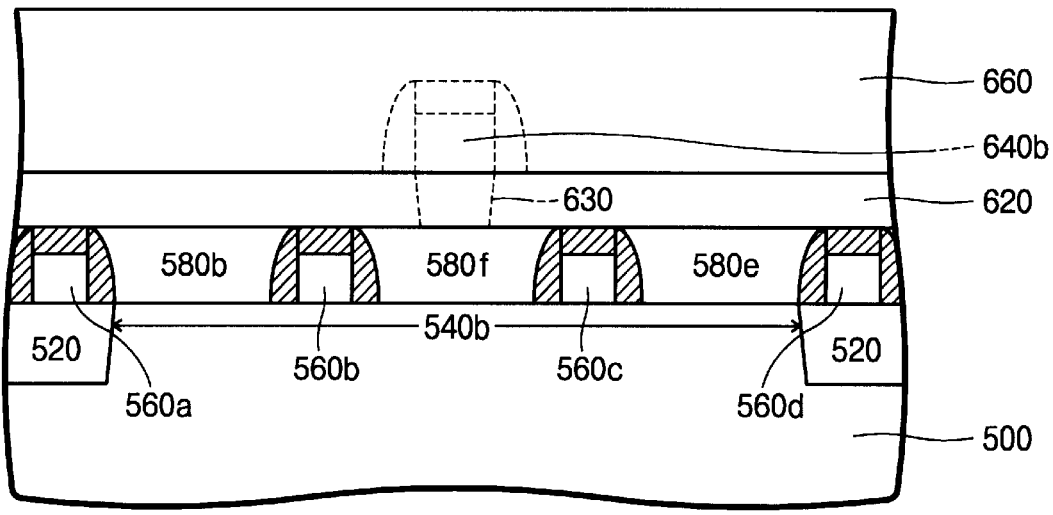
FIGS. 5A to 5J are cross-sectional views of a semiconductor substrate taken along line 4—4 of FIG. 2, at selected stages of the cylindrical capacitor fabrication process, in accordance with a second embodiment of the present invention.

Referring to FIG. 5A, as in the first embodiment, a device isolation region 520 is formed at a predetermined region of a semiconductor substrate 100, defining an active region 540b. A plurality of transistors 560a–d and a plurality of contact pads 580b, 580e, 580f are formed. A first insulating layer 620 is formed on the resulting structure.

A bit line contact hole 630 is opened in the first insulating layer 620 to expose the contact pad 580f. A bit line pattern 640b is formed. A bit line spacer is formed on sidewalls of the bit line pattern 640b. A second insulating layer 660 is formed on the resulting structure.

Figure 5B:
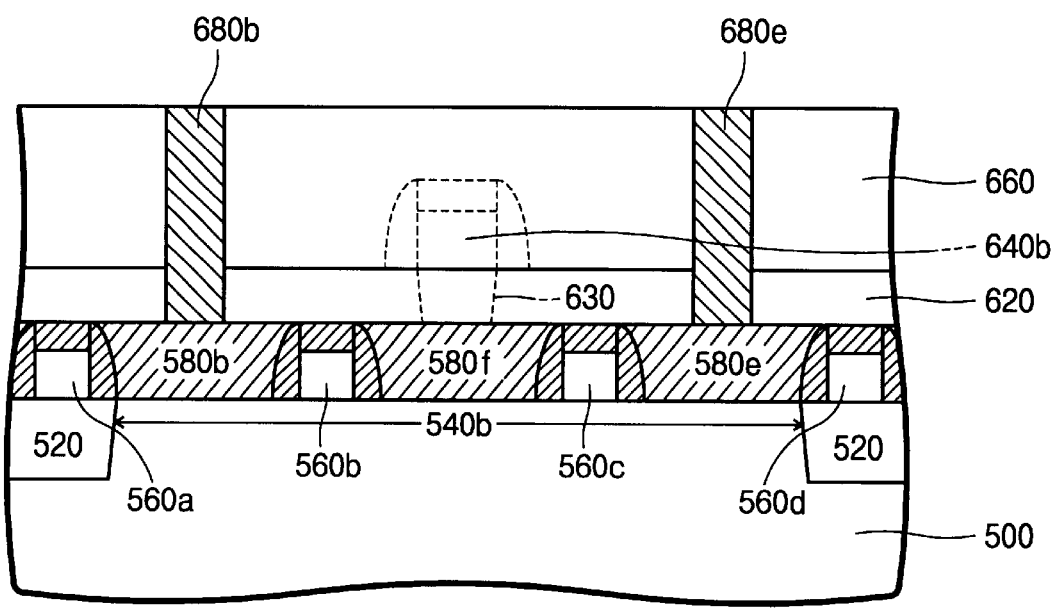

The next process sequence is the formation of a storage node contact plug. Referring to FIG. 5B, the second and first insulating layers 660 and 620 are patterned to form storage contact openings, exposing the contact pads 580b and 580e respectively. A conductive layer such as a doped polysilicon layer is formed on the second insulating layer 660 to fill the storage contact openings, and is then planarized down to the second insulating layer to form contact plugs 680b and 680e.

Figure 5C:
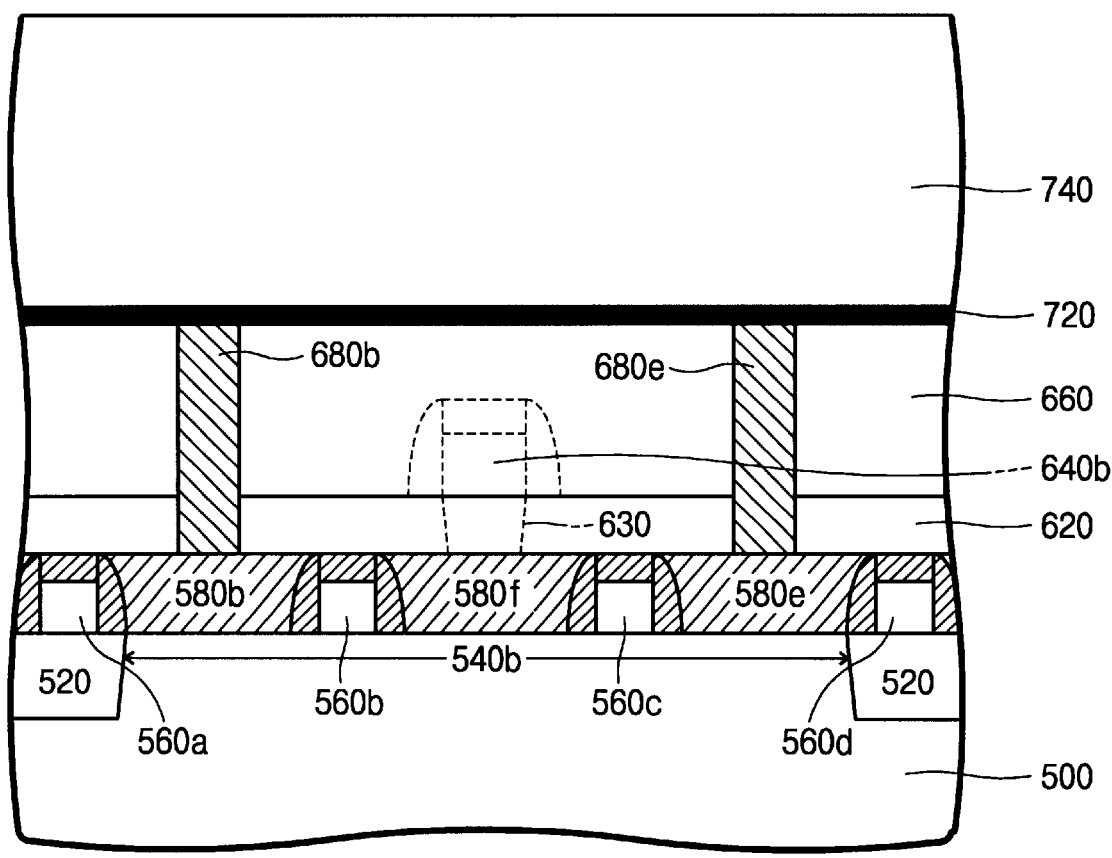

Referring now to FIG. 5C, an etch stopper 720 and a sacrificial oxide layer 740 are sequentially formed on the second insulating layer 660 and on the contact plugs 680b and 680e. The sacrificial oxide layer 740 determines the height of the storage node. The etch stopper layer is made of silicon nitride and serves as an end point during an etching process for the formation of storage node opening.

Figure 5D:
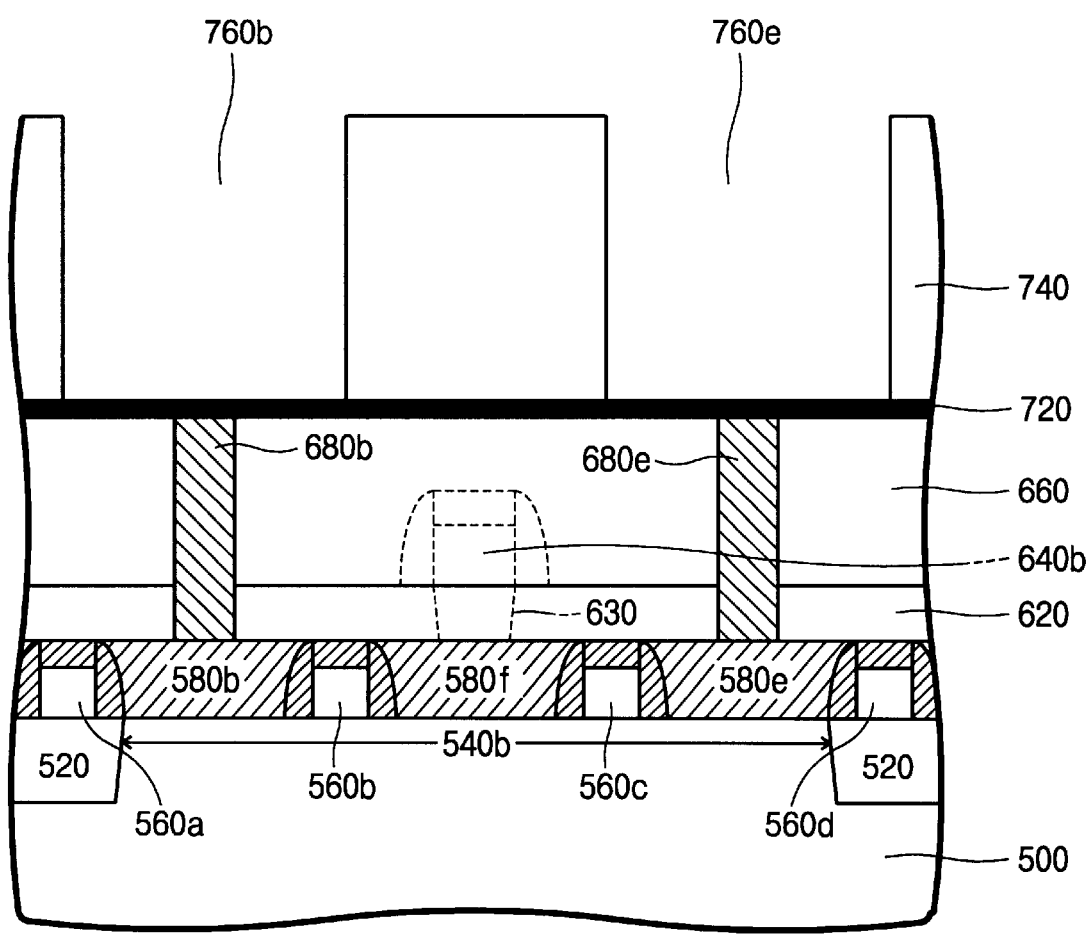
Figure 5E:
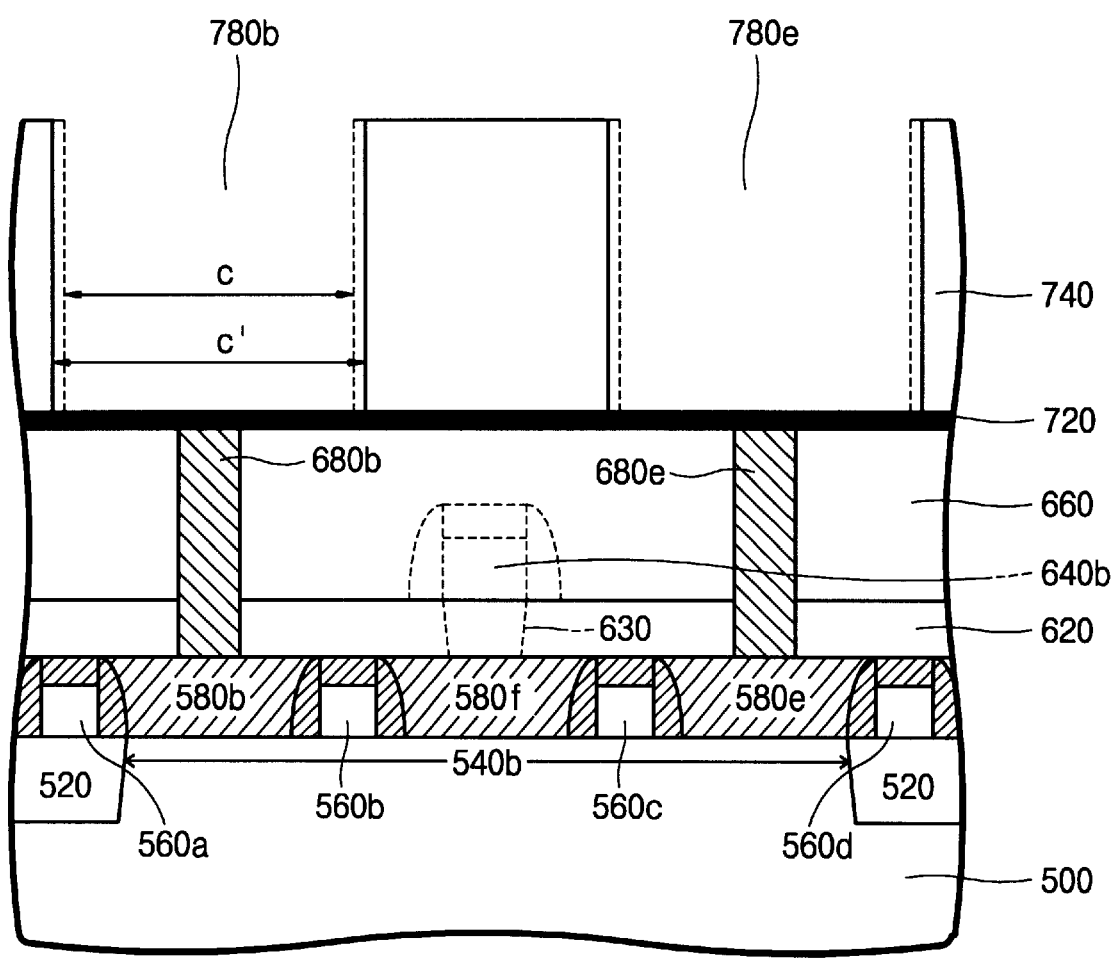

Referring now to FIG. 5D, the sacrificial oxide layer 740 is patterned to form storage node openings 760b and 760e until the etch stopper 720 is exposed. In order to increase the opening dimension from "c" to "c'", wet etching can be carried out on the sacrificial oxide layer 740. As a result, the storage node openings 760b and 760e are enlarged into openings 780b and 780e as shown in FIG. 5E.

Figure 5F:
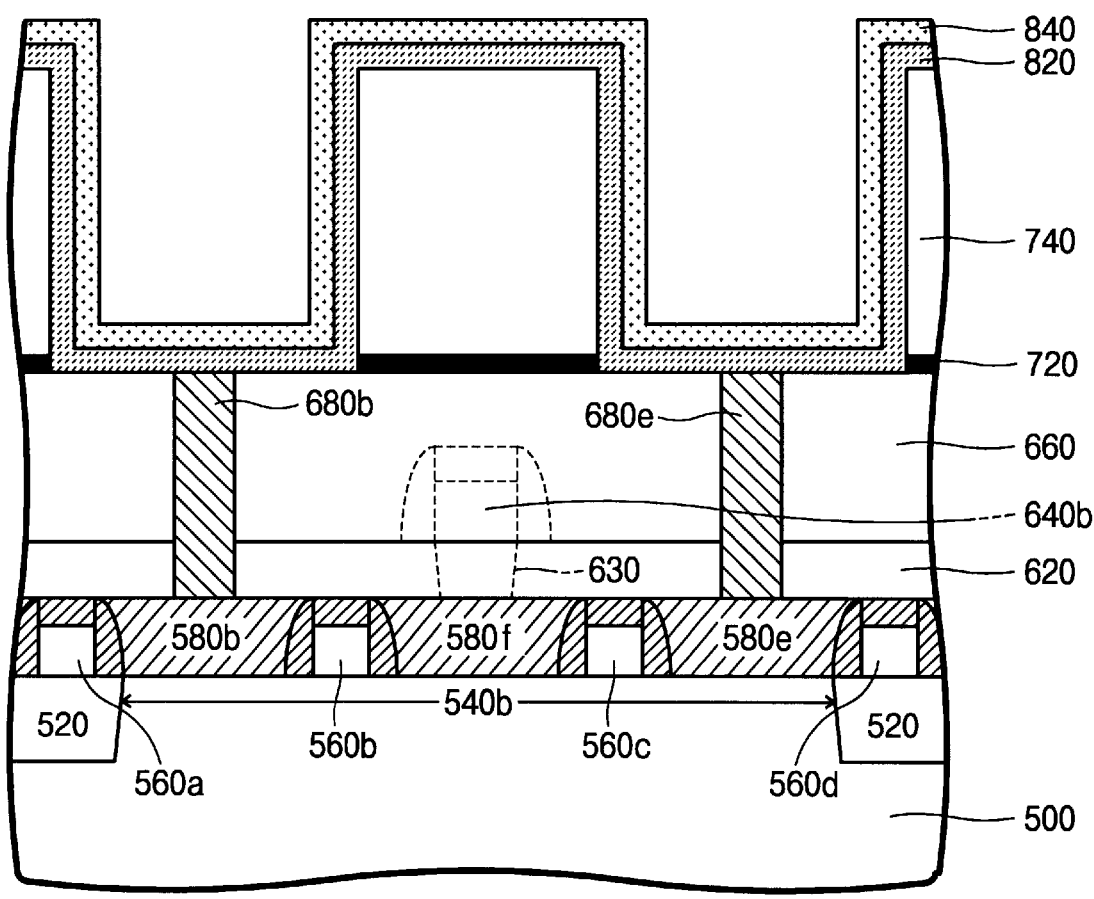

After enlarging the openings, underlying etch stopping layer 720 is etched to expose the contact plugs 680b and 680e, completing storage node openings, as may be understood in view of FIG. 5F.

The next process sequence is the formation of a capacitor storage node, which is identical to the first embodiment. Referring to FIG. 5F, first and second conductive layers 820 and 840 are formed on the sacrificial oxide layer 740. The first conductive layer 820 defines outer walls of the storage node, and is made of crystallized silicon. The second conductive layer defines inner walls and is made of amorphous silicon.

Figure 5G:
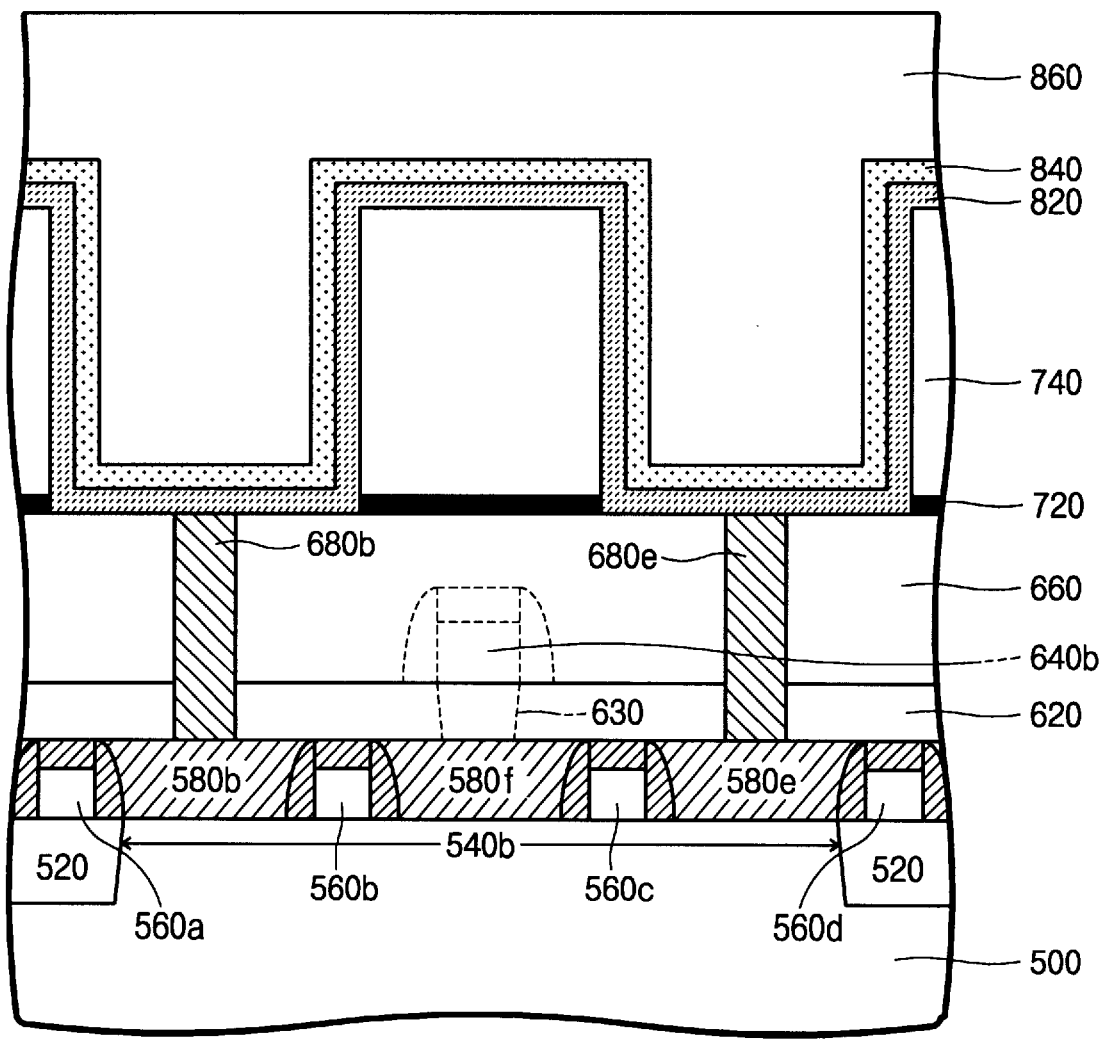
Figure 5H:
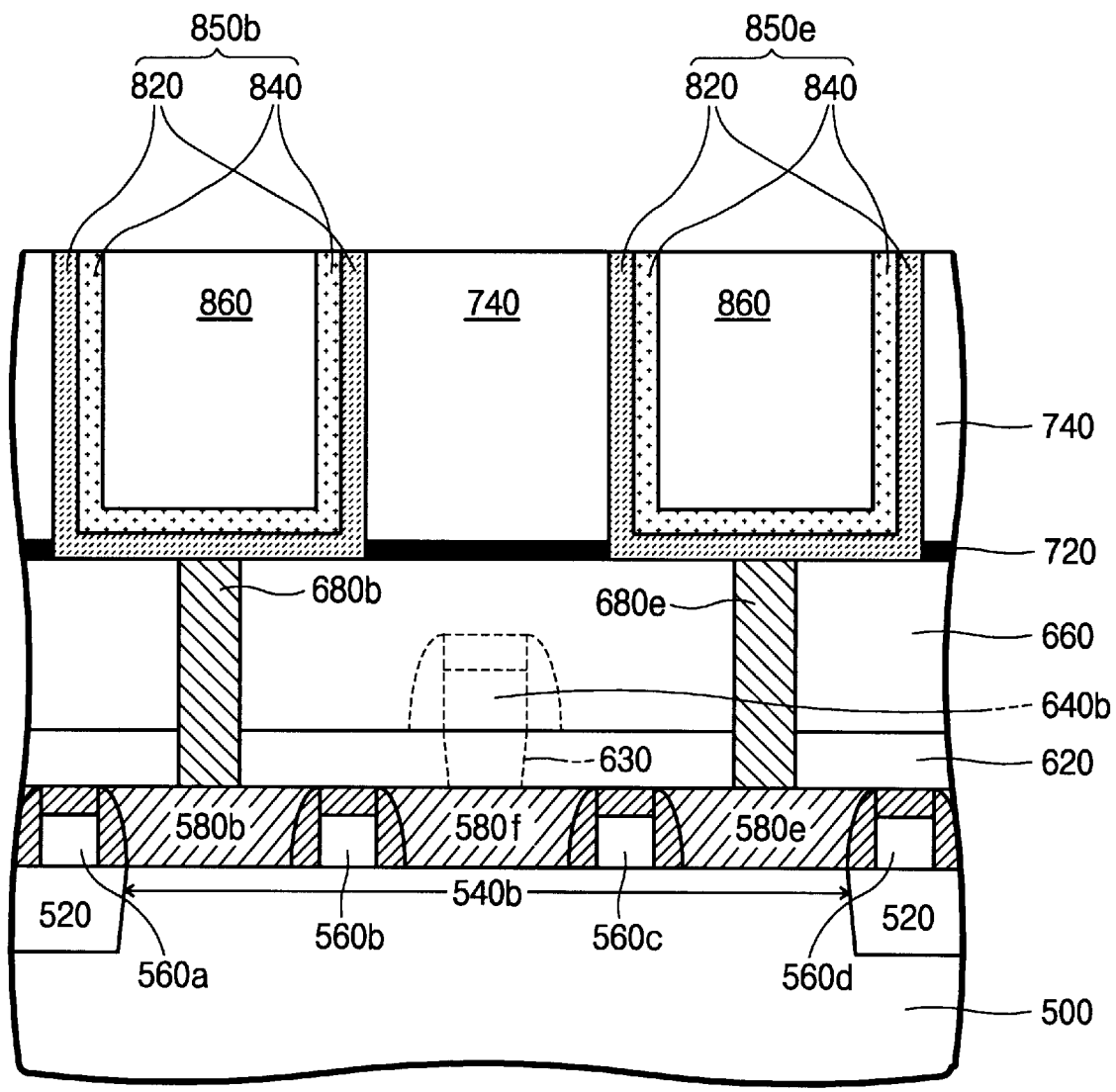

A sixth insulating layer 860 is deposited on the second conductive layer 840, as shown in FIG. 5G, and a planarization process is carried out until the second sacrificial oxide layer 740 is exposed, to form cylindrical storage nodes 850b and 850e in the storage node openings, as shown in FIG. 5H.

Figure 5I:
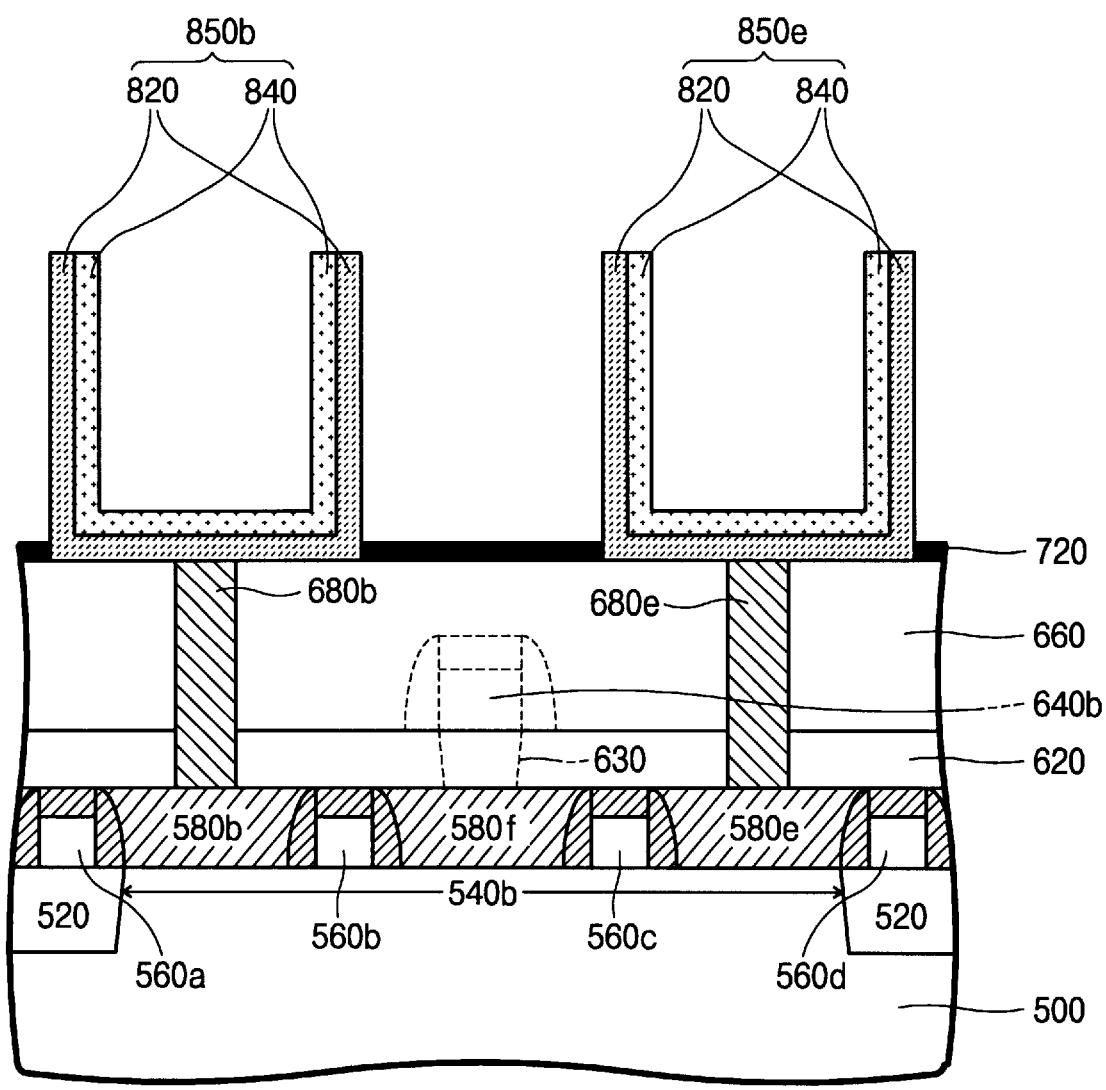
Figure 5J:
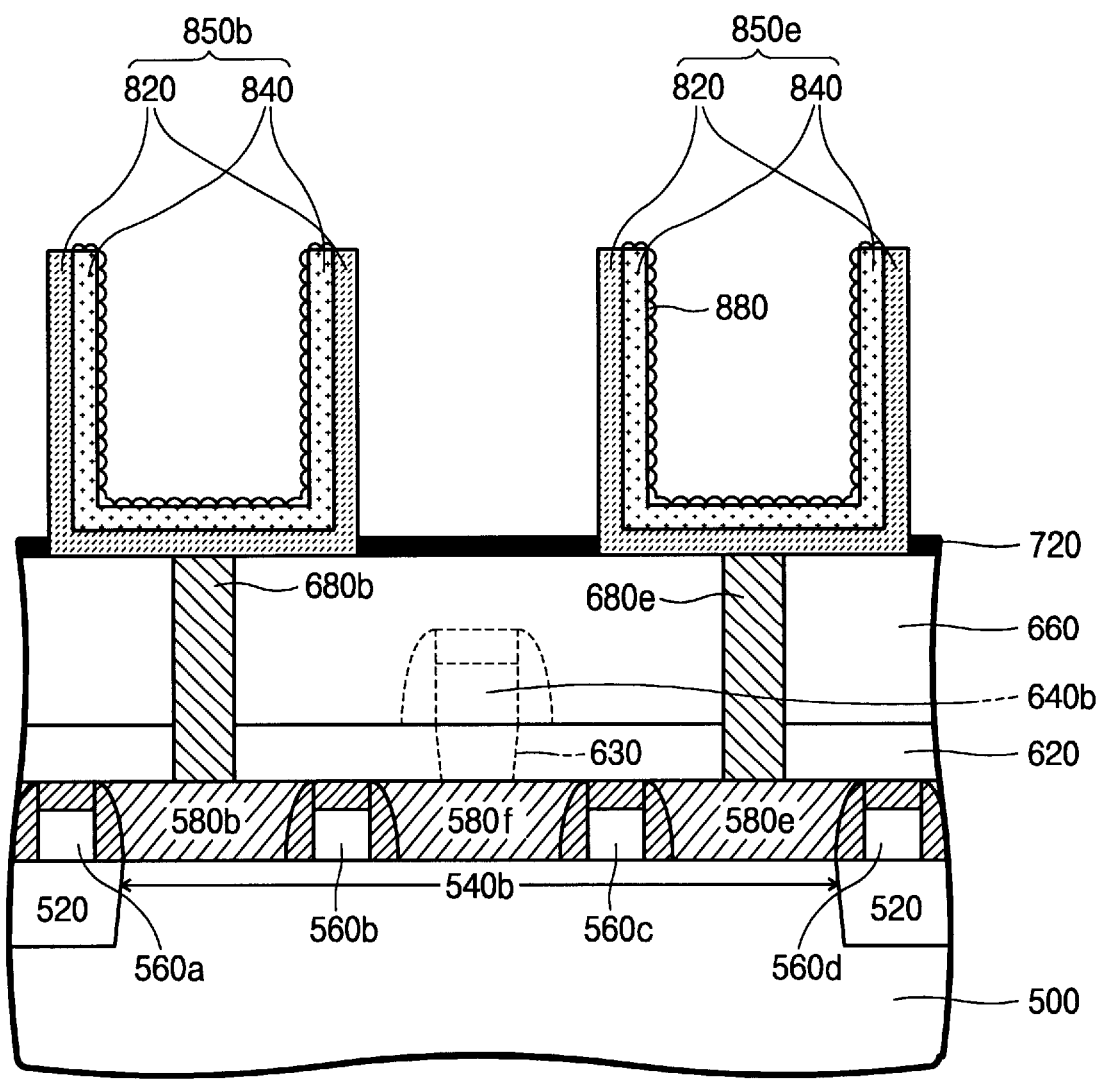

The remainder of the sixth insulating layer 860 and the sacrificial oxide layer 740 are removed to expose the inner walls and outer walls of the storage nodes, as shown in FIG. 5I. HSG silicon 880 is then formed on the inner walls of the storage nodes as shown in FIG. 5J. Subsequently, a capacitor dielectric process and a plate node process are conventionally carried out to complete a cylindrical capacitor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a capacitor storage node in a semiconductor device, comprising:
   sequentially forming a lower insulating layer, an etching stopper layer and an upper insulating layer on a semiconductor substrate;
   patterning the sequentially formed layers to form a storage opening to a predetermined portion of the semiconductor substrate;
   forming a conformal first conductive layer on the upper insulating layer and in the storage opening, the first conductive layer being polycrystalline silicon;
   forming a conformal second conductive layer on the first conductive layer, the second conductive layer being amorphous silicon;
   etching portions of the second and first conductive layers that are not within the storage opening, to form a storage node in the storage opening, the second conductive layer defining an inner wall of the storage node;
   removing the upper insulating layer to expose the first conductive layer, the first conductive layer defining an outer wall of the storage node; and
   forming HSG silicon only on the second conductive layer after said removing.

2. The method according to claim 1, wherein the upper insulating layer is silicon oxide and the etching stopper layer is silicon nitride.

3. The method according to claim 1, wherein said patterning comprises:
   patterning the upper insulating layer until the etching stopper layer is exposed, to form a storage node opening; and
   patterning the etching stopper layer and the lower insulating layer until the predetermined portion of the semiconductor substrate is exposed, to form a storage contact opening.

4. The method according to claim 3, further comprising selectively etching a part of the upper insulating layer with respect to the etching stopper layer, to enlarge a dimension of the storage node opening prior to said patterning the etching stopper layer and the lower insulating layer.

5. The method according to claim 3, wherein forming of the lower insulating layer comprises:
   forming a first insulating layer on the semiconductor substrate;
   forming a bit line on the first insulating layer;
   forming a second insulating layer on the first insulating layer and the bit line;
   forming a third insulating layer on the second insulating layer to prevent oxidation of the bit line; and
   forming a fourth insulating layer on the third insulating layer,
   the bit line being coated with a capping layer having an etching selectivity with respect to the first and second insulating layers, the third insulating layer having an etching selectivity with respect to the second and fourth insulating layers, and the etching stopper layer having an etching selectivity with respect to the fourth and upper insulating layers.

6. The method according to claim 5, wherein the first, second and fourth insulating layers are each respectively silicon oxide, and the etching stopper, capping and third insulating layers are each respectively silicon nitride,
   said patterning the etching stopper layer and the lower insulating layer comprises patterning the etching stopper layer and the fourth to first insulating layers between the bit line and an adjacent bit line, the second and first insulating layers being etched selectively with respect to the capping layer.

7. The method according to claim 6, wherein prior to said forming the first insulating layer on the semiconductor substrate, further comprising:
   forming a transistor on the semiconductor substrate;
   forming an insulator on the semiconductor substrate and on the transistor;

patterning the insulator until portions of the semiconductor substrate away from the transistor are exposed, to form a storage pad opening and a bit line pad opening; and filling the storage pad opening and the bit line pad opening with a conductive material, to form a storage pad and a bit line pad respectively, the bit line being electrically connected to the bit line pad, and the storage contact opening exposing the storage pad.

8. The method according to claim 1, wherein said etching comprises:

forming a planarization insulating layer on the second conductive layer to fill the storage opening;

etching the planarization insulating layer, the second conductive layer and the first conductive layer until an upper surface of the upper insulating layer is exposed; and removing remaining portions of the planarization insulating layer in the storage opening, to expose the second conductive layer.

9. The method according to claim 1, wherein said forming the first conductive layer comprises:

depositing a first amorphous silicon layer on the upper insulating layer and in the storage opening; and annealing the first amorphous silicon layer to form crystallized silicon, the second conductive layer being formed by depositing a second amorphous silicon layer on the crystallized silicon, wherein the HSG silicon is formed on the second amorphous silicon layer.

10. The method according to claim 9, wherein the first amorphous silicon layer has a thickness of about 100 angstroms to 300 angstroms, and the second amorphous silicon layer has a thickness of about 200 angstroms to 300 angstroms.

11. A method of fabricating a capacitor storage node in a semiconductor device, comprising:

forming a transistor on a semiconductor substrate;

forming an insulator on the semiconductor substrate and on the transistor;

forming a storage pad and a bit line pad in the insulator away from the transistor, to be in contact with the semiconductor substrate;

forming a first insulating layer on the insulator and on the pads;

forming a bit line on the first insulating layer electrically connected to the bit line pad through the first insulating layer, the bit line being coated with a capping layer;

sequentially forming second, third and fourth insulating layers on the first insulating layer and on the bit line;

forming an etching stopper layer on the fourth insulating layer;

forming a fifth insulating layer on the etching stopper layer;

patterning the fifth to first insulating layers and the etching stopper layer to form a storage opening exposing the storage pad;

forming conformal first and second conductive layers on the fifth insulating layer and in the storage opening;

forming a sixth insulating layer on the fifth insulating layer to fill the storage opening;

etching the sixth insulating layer and the second and first conductive layers until the fifth insulating layer is exposed, to form a storage node in the storage opening;

removing the fifth insulating layer and remaining portions of the six insulating layer in the storage opening, to expose both an outer wall of the storage node defined by the first conductive layer and an inner wall of the storage node defined by the second conductive layer; and forming HSG silicon on the inner wall of the storage node.

12. The method according to claim 11, wherein the first conductive layer is formed by depositing first amorphous silicon on the fifth insulating layer including the storage opening, and annealing the first amorphous silicon to form crystallized silicon, the second conductive layer being formed by depositing second amorphous silicon on the crystallized silicon.

13. The method according to claim 12, wherein the first amorphous silicon has a thickness of about 100 angstroms to 300 angstroms, and the second amorphous silicon has a thickness of about 200 angstroms to 300 angstroms.

14. The method according to claim 11, wherein the first, second, fourth and fifth insulating layers are each respectively an oxide, and the third insulating, capping and etching stopper layers are each respectively silicon nitride.

15. The method according to claim 11, wherein patterning comprises:

patterning the fifth insulating layer until the etching stopper layer is exposed, to form a first opening; and patterning the etching stopper layer and the fourth to first insulating layers until the storage pad is exposed, to form a second opening aligned with the first opening.

16. The method according to claim 15, further comprising selectively etching the fifth insulating layer with respect to the etching stopper layer, to enlarge the dimension of the first opening, prior to said patterning the etching stopper layer and the fourth to first insulating layers.

17. The method according to claim 16, wherein said selectively etching the fifth insulating layer comprises a wet etching.

18. A method of fabricating a capacitor storage node in a semiconductor device, comprising:

forming a transistor on a semiconductor substrate;

forming an insulator on the semiconductor substrate and on the transistor;

forming a storage pad and a bit line pad in the insulator to be in contact with the semiconductor substrate, both being away from the transistor;

forming a first insulating layer on the insulator and on the pads;

forming a bit line on the first insulating layer to be electrically connected to the bit line pad through the first insulating layer, the bit line being coated with a capping layer;

forming a second insulating layer on the first insulating layer and on the bit line;

forming a storage contact plug in the second insulating layer to be in contact with the storage pad;

forming an etching stopper layer and a sacrificial insulating layer on the second insulating layer and on the storage contact plug;

patterning the sacrificial insulating layer and the etching stopper layer to form a storage node opening exposing the storage contact plug;

forming conformal first and second conductive layers on the sacrificial-insulating layer and in the storage node opening;

etching portions of the second and first conductive layer outside the storage node opening to form a storage node in the storage node opening, the second conductive layer defining an inner wall of the storage node;

removing the sacrificial insulating layer to expose an outer wall of the storage node defined by the first conductive layer; and forming HSG silicon on the inner wall of the storage node.

19. The method according to claim 18, wherein the first conductive layer is polycrystalline silicon and the second conductive layer is amorphous silicon.

20. The method according to claim 18, wherein the sacrificial insulating layer and the second and first insulating layers are each respectively silicon oxide, and the etching stopper layer is silicon nitride.

21. The method according to claim 18, wherein said etching comprises:

forming a planarization insulating layer on the second conductive layer to fill the storage node opening;

etching the planarization insulating layer, the second conductive layer and the first conductive layer until an upper surface of the sacrificial insulating layer is exposed; and removing remaining portions of the planarization insulating layer in the storage node opening, to expose the second conductive layer.

22. The method according to claim 18, wherein the first conductive layer is formed by depositing first amorphous silicon on the sacrificial insulating layer and the storage node opening, and annealing the first amorphous silicon to form crystallized silicon, the second conductive layer being formed by depositing second amorphous silicon on the crystallized silicon.

23. The method according to claim 18, wherein said patterning comprises:

patterning the sacrificial oxide layer;

patterning the etching stopper layer; and selectively etching a part of the patterned sacrificial insulating layer, to enlarge a dimension of the storage opening, prior to said patterning the etching stopper layer.

* * * * *